US010780586B2

(12) United States Patent
Kitahara et al.

(10) Patent No.: US 10,780,586 B2
(45) Date of Patent: Sep. 22, 2020

(54) HORIZONTAL ARTICULATED ROBOT WITH BEVEL GEARS

(71) Applicant: NIDEC SANKYO CORPORATION, Nagano (JP)

(72) Inventors: Yasuyuki Kitahara, Nagano (JP); Toshimichi Kazama, Nagano (JP); Tamotsu Kuribayashi, Nagano (JP); Masayoshi Saichi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 16/580,276

(22) Filed: Sep. 24, 2019

(65) Prior Publication Data

US 2020/0016765 A1 Jan. 16, 2020

Related U.S. Application Data

(60) Continuation-in-part of application No. 15/854,487, filed on Dec. 26, 2017, now abandoned, which is a
(Continued)

(30) Foreign Application Priority Data

Nov. 29, 2013 (JP) ................................. 2013-247026
Nov. 29, 2013 (JP) ................................. 2013-247029

(51) Int. Cl.
*B25J 11/00* (2006.01)
*B65G 47/90* (2006.01)
(Continued)

(52) U.S. Cl.
CPC ........... *B25J 11/0095* (2013.01); *B25J 9/042* (2013.01); *B25J 9/044* (2013.01); *B25J 18/04* (2013.01);
(Continued)

(58) Field of Classification Search
CPC ... B25J 9/042; B25J 9/043; B25J 9/044; B25J 11/0095; H01L 21/677
See application file for complete search history.

(56) References Cited

U.S. PATENT DOCUMENTS

| 5,022,695 A | 6/1991 | Ayers |
| 5,702,228 A | 12/1997 | Tamai et al. |

(Continued)

FOREIGN PATENT DOCUMENTS

| JP | S63147704 U | 9/1988 |
| JP | 04304985 A | 10/1992 |

(Continued)

OTHER PUBLICATIONS

International Search Report corresponding to Application No. PCT/JP2014/070736; dated Nov. 11, 2014, with English translation.
(Continued)

*Primary Examiner* — Gerald McClain
(74) *Attorney, Agent, or Firm* — Cantor Colburn LLP

(57) ABSTRACT

A horizontal articulated robot may include a hand; an arm having at least two arm portions including a supporting-arm portion to which said hand is rotatably joined and a supported-arm portion to which the base end of said hand-side arm portion is rotatably joined; a main body portion; and a rotation mechanism structured to rotate said supported-arm portion. The rotation mechanism may include a motor which is arranged such that an axial direction of an output shaft of the motor coincides with a horizontal direction; a Harmonic Drive (registered trade mark) wave-motion gearing device structured to reduce the power of said motor; a first bevel gear coupled to said output shaft; and a second bevel gear coupled with a wave generator of said Harmonic Drive (registered trade mark) wave-motion gearing device and which meshes with said first bevel gear.

4 Claims, 12 Drawing Sheets

Related U.S. Application Data division of application No. 14/899,410, filed as application No. PCT/JP2014/070736 on Aug. 6, 2014, now Pat. No. 10,195,743.

(60) Provisional application No. 61/864,272, filed on Aug. 9, 2013.

(51) Int. Cl.
    *H01L 21/677*      (2006.01)
    *B25J 18/04*      (2006.01)
    *B25J 9/04*      (2006.01)
    *H01L 21/687*      (2006.01)

(52) U.S. Cl.
CPC .......... *B65G 47/90* (2013.01); *B65G 47/902* (2013.01); *H01L 21/67766* (2013.01); *H01L 21/67778* (2013.01); *H01L 21/67781* (2013.01); *H01L 21/68707* (2013.01); *Y10S 901/14* (2013.01); *Y10S 901/17* (2013.01)

(56) References Cited

U.S. PATENT DOCUMENTS

| | | |
|---|---|---|
| 5,929,585 A | 7/1999 | Fujita |
| 8,006,586 B2 * | 8/2011 | Tealdi .................. B25J 19/0029 74/490.02 |
| 9,691,651 B2 | 6/2017 | Coady |
| 2002/0068992 A1 | 6/2002 | Hine et al. |
| 2003/0145674 A1 | 8/2003 | Weaver |
| 2004/0068347 A1 | 4/2004 | Aalund et al. |
| 2005/0011294 A1 | 1/2005 | Hashimoto et al. |
| 2005/0265814 A1 | 12/2005 | Coady |
| 2013/0074651 A1 | 3/2013 | Furuichi et al. |
| 2014/0324208 A1 | 10/2014 | Miner et al. |
| 2015/0147148 A1 | 5/2015 | Coady |
| 2016/0133502 A1 | 5/2016 | Won et al. |
| 2016/0136819 A1 | 5/2016 | Kitahara et al. |
| 2016/0184986 A1 | 6/2016 | Procyshyn et al. |
| 2017/0301576 A1 | 10/2017 | Coady |

FOREIGN PATENT DOCUMENTS

| | | |
|---|---|---|
| JP | 08090463 A | 4/1996 |
| JP | 2001235036 A | 8/2001 |
| JP | 2002264067 A | 9/2002 |
| JP | 2005039047 A | 2/2005 |
| JP | 2008264980 A | 11/2008 |
| JP | 2011230256 A | 11/2011 |

OTHER PUBLICATIONS

USPTO Final Office Action corresponding to U.S. Appl. No. 15/854,487; dated May 24, 2019.
USPTO Non-Final Office Action corresponding to U.S. Appl. No. 14/899,410; dated Apr. 13, 2018.
USPTO Non-Final Office Action corresponding to U.S. Appl. No. 15/854,487; dated Nov. 9, 2018.

* cited by examiner

Fig. 2
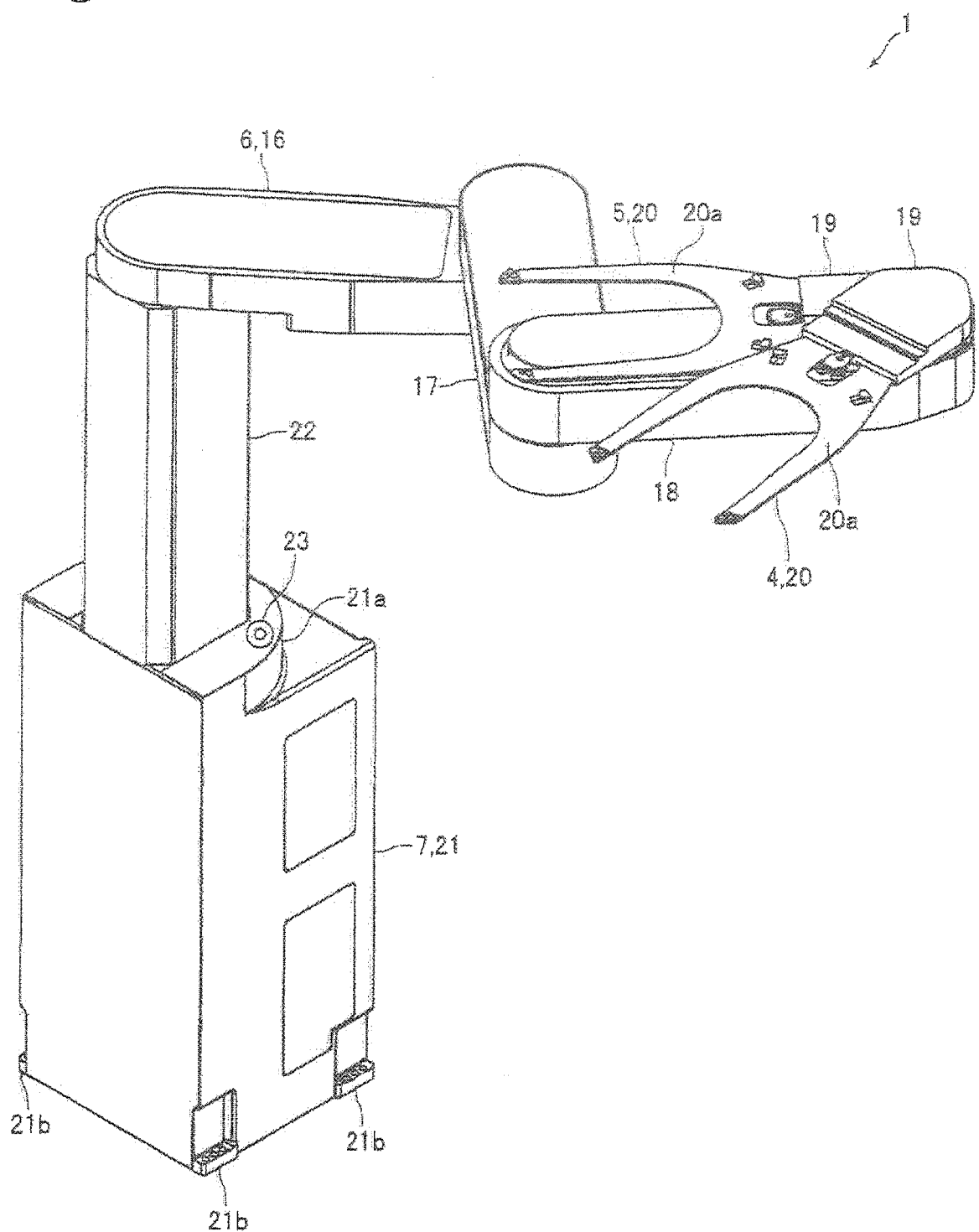
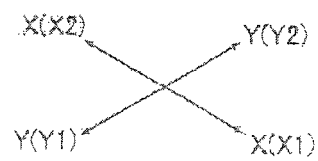

Fig. 3
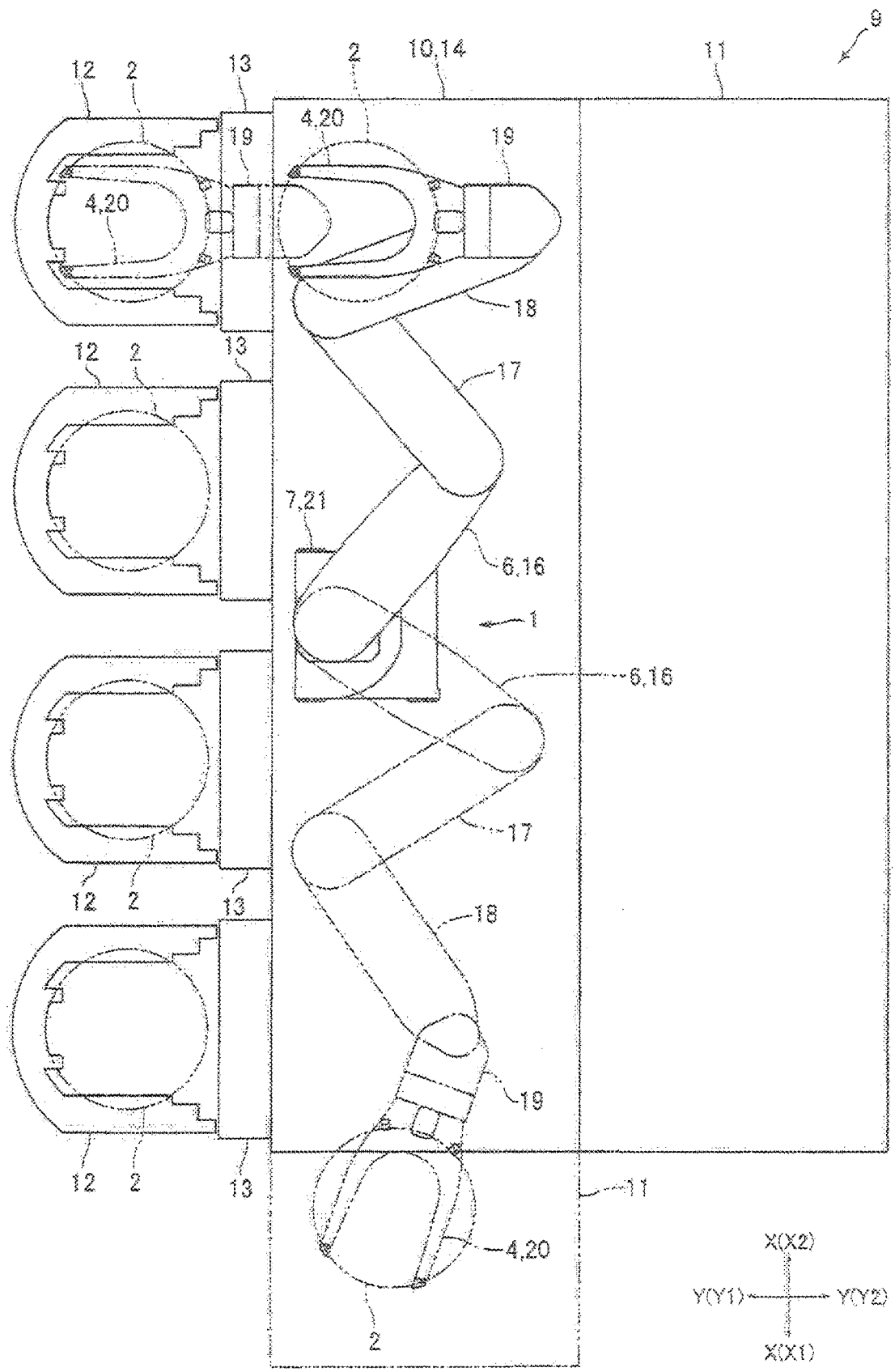
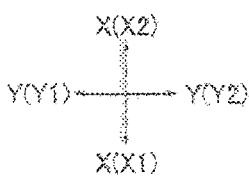

Fig. 6
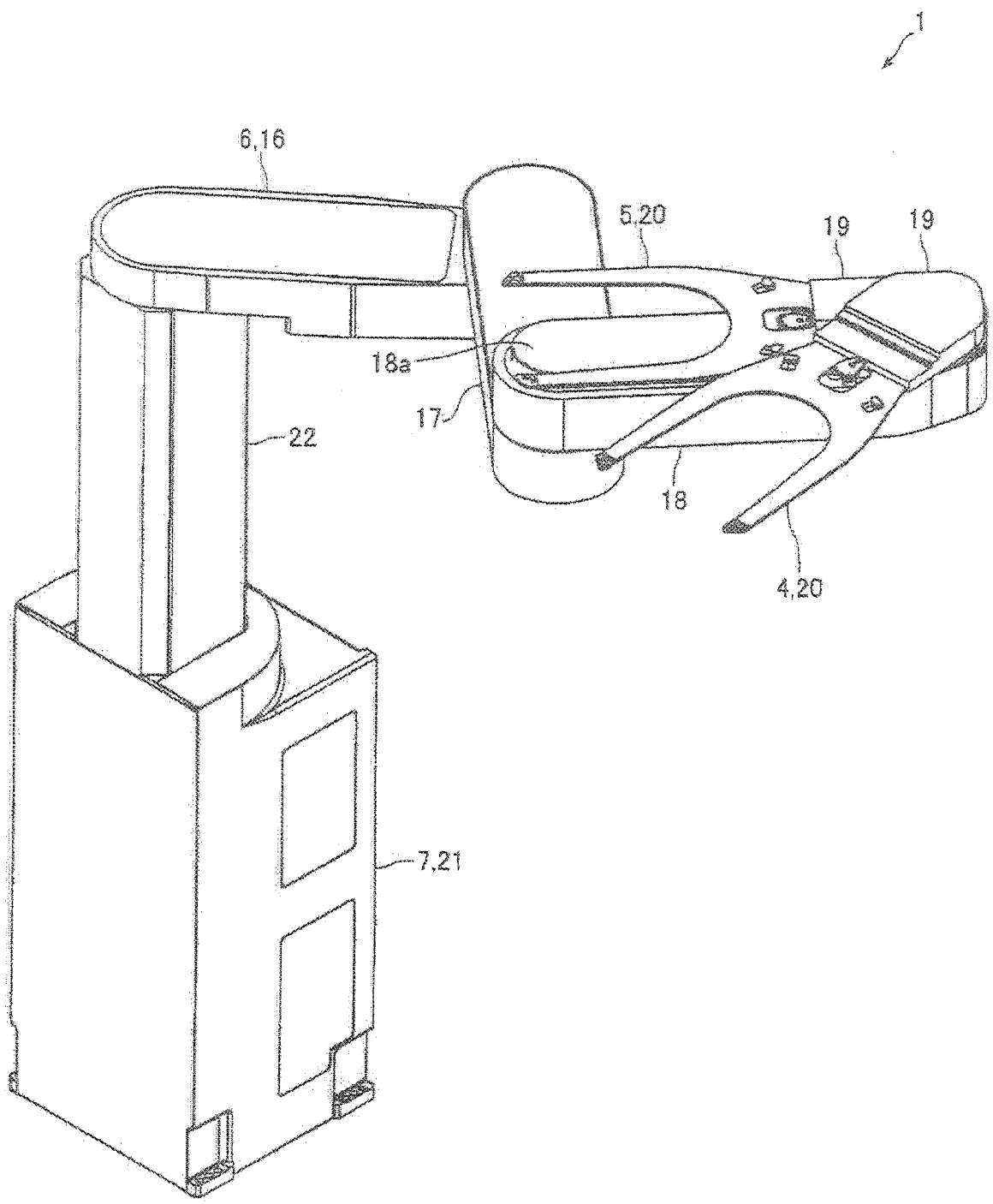
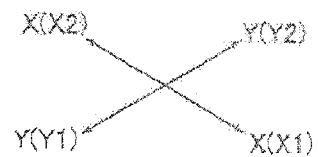

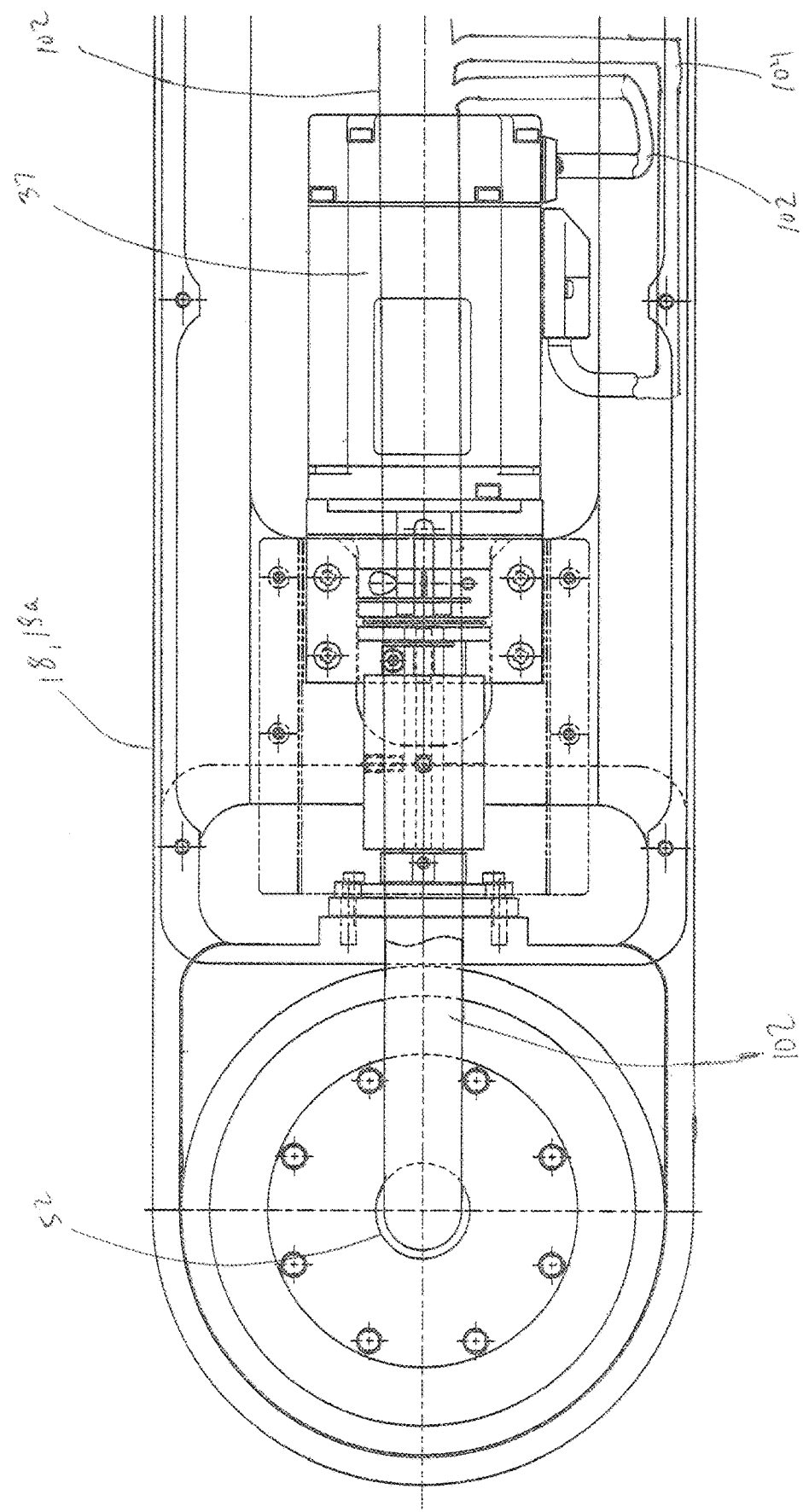

HORIZONTAL ARTICULATED ROBOT WITH BEVEL GEARS

CROSS REFERENCE TO RELATED APPLICATIONS

This patent application is a Continuation-in-Part of U.S. patent application Ser. No. 15/854,487 filed on Dec. 26, 2017, priority to which is claimed under 35 U.S.C. § 120, and the contents of which are incorporated herein by reference. U.S. patent application Ser. No. 15/854,487 is a divisional patent application of U.S. patent application Ser. No. 14/899,410 filed Dec. 17, 2015, priority to which is claimed under 35 U.S.C. § 120, and the contents of which are incorporated herein by reference. U.S. patent application Ser. No. 14/899,410 is a U.S. national stage of International Patent Application No. PCT/JP2014/070736, filed on Aug. 6, 2014. Priority under 35 U.S.C. § 119(a) and 35 U.S.C. § 365(b) is claimed from Japanese Patent Applications Nos. 2013-247026, filed Nov. 29, 2013; and 2013-247029, filed Nov. 29, 2013; the disclosures of which are incorporated herein by reference. Priority is also claimed under 35 U.S.C. § 119(e) to U.S. Provisional Patent Application No. 61/864,272, filed Aug. 9, 2013, the disclosure of which is incorporated herein by reference.

FIELD OF THE INVENTION

At least an embodiment of the present invention relates to a horizontal articulated robot with an arm which moves in the horizontal direction, and a method for manufacturing the horizontal articulated robot.

BACKGROUND

Conventionally known is a horizontal articulated robot which configures part of an EFEM (Equipment Front End Module) and which transfers semiconductor wafers between a FOUP (or multiple FOUPs) and a semiconductor wafer processing apparatus (Patent reference 1, for example). The industrial robot disclosed in Patent reference 1 is provided with two hands on which semiconductor wafers are to be mounted, an arm, to which the two hands are rotatably joined to the front end thereof, and a main body portion, to which the base end of the arm is rotatably joined. The arm is configured by a first arm, of which the base end is rotatably joined to the main body portion, a second arm, of which the base end is rotatably joined to the front end of the first arm, and a third arm, of which the base end is rotatably joined to the front end of the second arm and to which the hands are rotatably joined to the front end thereof. An arm-elevating mechanism is housed inside the main body portion to raise and lower the first arm.

Also, known as a vertical articulated robot is one equipped with a base, a body fixed to the base, a first arm which is rotatably joined to the body, a second arm which is rotatably joined to the first arm, a wrist which is rotatably joined to the second arm, and fingers which are rotatably joined to the wrist (see Patent reference 2, for example). In the vertical articulated robot disclosed in Patent reference 2, a level for adjusting the original position is attached to the first arm and the fingers.

Also, conventionally known is a horizontal articulated robot for transferring semiconductor wafers (see Patent reference 1, for example). A horizontal articulated robot disclosed in Patent reference 3 is equipped with a hand on which semiconductor wafers are to be mounted, an arm to which the hand is rotatably joined to the front end thereof, and a base to which the base end of the arm is rotatably joined. The arm is configured by a first arm portion, of which the base end is rotatably joined to the base, and a second arm, of which the base end is rotatably joined to the front end of the first arm portion and to which the hand is rotatably joined to the front end thereof.

In the horizontal articulated robot disclosed in Patent reference 3, a turning drive means is equipped to rotate the second arm portion with respect to the first arm portion. The turning drive means is provided with a motor which is arranged inside the first arm portion such that the axial direction of the output shaft coincides with the horizontal direction, a first bevel gear which is coupled with the output shaft of the motor, a second bevel gear which meshes with the first bevel gear, a third gear which is formed at the bottom end of a cylindrical protrusion secured to the base end of the second arm portion, and a second gear which meshes with the third gear and is formed integrally with the second bevel gear.

PATENT REFERENCE

[Patent reference 1] Unexamined Japanese Patent Application Publication 2011-230256
[Patent reference 2] Unexamined Utility Model Application Publication 63-147704
[Patent reference 3] Unexamined Japanese Patent Application Publication 2008-264980

A FOUP is manufactured based on a SEMI (Semiconductor Equipment and Materials Institute) standard; multiple semiconductor wafers are stored in a FOUP such that they are superposed at a fixed pitch in the up-down direction. A gap is created between multiple semiconductor wafers stored in the FOUP, and the gap is relatively small. A horizontal articulated robot which transfers semiconductor wafers between a FOUP and a semiconductor wafer processing apparatus needs to put its hand in the small gap between the multiple semiconductor wafers stored in the FOUP, mounts a semiconductor wafer on the hand and takes it out of the FOUP. Therefore, the horizontal articulated robot needs to be precisely installed so that the hand precisely moves in the horizontal direction.

In general, to precisely install the horizontal articulated robot, the inclination of the hand or the like is studied in its every state, such as the state where the arm is extended in a certain direction, the state where the arm is extended in the other direction and the state where the arm is retracted, by using a level at the time of the installation of the horizontal articulated robot while changing the states of the horizontal articulated robot so that the hand can make optimal movements in the horizontal direction. For this reason, it takes time to install the horizontal articulated robot which transfers semiconductor wafers. Also, since the inside of the EFEM housing in which the horizontal articulated robot is housed is not very spacious, the work of installing the horizontal articulated robot is difficult.

SUMMARY

Therefore, at least an embodiment of the present invention provides a horizontal articulated robot with an arm moving in the horizontal direction, which can be installed such that a hand can make precise movements in the horizontal direction with ease in a short amount of time. Also, at least an embodiment of the present invention provides a method for manufacturing a horizontal articulated robot having an arm to move in the horizontal direction, which can be installed such that a hand can make precise movements in the horizontal direction with ease in a short amount of time.

Next, in the horizontal articulated robot disclosed in Patent reference 3, a motor is arranged inside the first arm portion such that the axial direction of the output shaft coincides with the horizontal direction; therefore, even when a motor is arranged inside the first arm portion, the first arm portion can be made thin. However, in this horizontal articulated robot, the power force of the motor which configures a turning drive means is transmitted to the second arm portion via a first bevel gear, a second bevel gear, a second gear and a third gear; therefore, it is difficult to increase the reduction ratio in the power-transmitting path from the motor to the second arm portion. Therefore, in this horizontal articulated robot, a motor having a large output needs to be used for the motor configuring the turning drive means, thus increasing the size of the motor. Also, in this horizontal articulated robot, the power force of the motor is transmitted to the second arm portion via the first bevel gear, the second bevel gear, the second gear and the third gear, therefore, this increases backlash in the power-transmitting path from the motor to the second arm portion.

Therefore, at least an embodiment of the present invention provides a horizontal articulated robot having a motor inside an arm portion that configures part of an arm, the motor being positioned such that the axial direction of its output shaft coincides with the horizontal direction, capable of reducing the size of the motor and reducing backlash.

To achieve the above, a horizontal articulated robot of at least an embodiment of the present invention having an arm that moves in the horizontal direction comprises a hand on which objects-to-be-transferred are to be mounted, and an arm configured by at least two arm portions, a hand-side arm portion to which the hand is rotatably joined to the front end thereof and a second hand-side arm portion to which the base end of the hand-side arm portion is rotatably joined to the front end thereof, a main body portion to which the base end of the arm is rotatably joined; wherein after the inclination of the center axis of rotation of the hand-side arm portion relative to the second hand-side arm portion is adjusted with respect to the vertical direction, a level is attached to the hand, the arm or the main body portion.

Also, to achieve the above, a method for manufacturing a horizontal articulated robot of at least an embodiment of the present invention is a method for manufacturing a horizontal articulated robot which comprises a hand, on which objects-to-be-transferred are to be mounted, an arm configured by at least two arm portions, that are a hand-side arm portion which the hand is rotatably joined to the front end thereof and a second hand-side arm portion which the base end of the hand-side arm portion is rotatably joined to the front end thereof, a main body portion to which the base end of the arm is rotatably joined, and a level which is attached to the hand, the arm or the main body portion; wherein the level is attached after the inclination of the center axis of rotation of the hand-side arm portion relative to the second hand-side arm portion is adjusted with respect to the vertical direction.

The horizontal articulated robot of at least an embodiment of the present invention is equipped with a hand on which objects-to-be-transferred are to be mounted, a hand-side arm portion to which the hand is rotatably joined, a second hand-side arm portion to which the hand-side arm portion is rotatably joined, and a level which is attached to the hand, the arm or the main body portion after the inclination of the center axis of rotation of the hand-side arm portion relative to the second hand-side arm portion is adjusted with respect to the vertical direction. Also, in a method for manufacturing a horizontal articulated robot of at least an embodiment of the present invention, a level is attached to the hand, the arm or the main body portion after at least the inclination of the center axis of rotation of the hand-side arm portion relative to the second hand-side arm portion is adjusted with respect to the vertical direction.

Therefore, in at least an embodiment of the present invention, by positioning the horizontal articulated robot in such that a level attached to the horizontal articulated robot indicates a predetermined condition, the horizontal articulated robot can be installed such that the inclination of the center axis of rotation of the hand-side arm portion, to which the hand is rotatably joined, with respect to the second hand-side arm portion is an appropriate inclination with respect to the vertical direction and the inclination of the hand is an appropriate inclination with respect to the horizontal direction. Therefore, in at least an embodiment of the present invention, the horizontal articulated robot can be installed so that the hand makes precise movements in the horizontal direction with ease with relatively small amount of time, compared to the above-described conventional method for manufacturing a horizontal articulated robot.

In at least an embodiment of the present invention, it is preferred that a mounting face on which objects-to-be-mounted are to be mounted be formed to the hand and the level be attached after the inclination of the mounting face is adjusted with respect to the horizontal direction. With this configuration, by positioning the horizontal articulated robot in such a way that the level attached to the horizontal articulated robot indicates a predetermined condition, the horizontal articulated robot can be installed so that the hand can make more precise movements in the horizontal direction.

In at least an embodiment of the present invention, the level is a bubble tube-type level with a bubble tube, and after at least the inclination of the center axis of rotation of the hand-side arm portion with respect to the second hand-side arm portion is adjusted with respect to the vertical direction, the level is attached such that a bubble inside the bubble tube is contained within the reference line printed on the tube. In this case, by positioning the horizontal articulated robot in such a way that the bubble inside the bubble tube of the level are contained within the reference line, the horizontal articulated robot can be installed such that the inclination of the center axis of rotation of the hand-side arm portion with respect to the second hand-side arm portion is appropriate with respect to the vertical direction and the inclination of the hand is appropriate with respect to the horizontal direction.

In at least an embodiment of the present invention, it is preferred that the level be attached to the main body portion. In case the level is a bubble tube-type level, if the level is attached to the arm or the hand, the bubble inside the bubble tube is easily displaced according to the extended/retracted condition of the arm; therefore, even if the horizontal articulated robot is positioned such that the bubble is contained within the reference line, the horizontal articulated robot may not be installed such that the inclination of the hand with respect to the horizontal direction is an appropriate inclination, depending on the extended or retracted condition of the arm at the time of installation. On the other hand, when the level is attached to the main body portion, the bubble inside the bubble tube is rarely displaced even when the arm changes its extended/retracted position; therefore, by positioning the horizontal articulated robot such that the bubble is contained within the reference line, the horizontal articulated robot can be installed in such a way that the inclination of the hand with respect to the horizontal direction is an appropriate inclination regardless of the extended or retracted condition of the arm at the time of installation.

Next, to achieve the above, the horizontal articulated robot with an arm which moves in the horizontal direction, of at least an embodiment of the present invention, comprises a hand on which objects-to-be-transferred are to be mounted, an arm which is configured by at least two arm portions, namely, a supporting-arm portion and a supported-arm portion which are relatively rotatably connected to each other and to which the hand is rotatably joined, a main body portion to which the base end of the arm is rotatably joined, and a rotation mechanism for rotating the supported-arm portion with respect to the supporting-arm portion; wherein the rotation mechanism has a motor which is arranged inside the supporting-arm portion or the supported-arm portion such that the axial direction of the output shaft is in the horizontal direction, a Harmonic Drive (registered trade mark) wave-motion gearing device which configures a joint, which is a joining portion between the supporting-arm portion and the supported-arm portion, and which reduces the power of the motor and transmits the result to the supporting-arm portion or the supported-arm portion, a first bevel gear coupled with the output shaft of the motor, and a second bevel gear which is coupled with a wave generator of the Harmonic Drive (registered trade mark) wave-motion gearing device and meshes with the first bevel gear.

In the horizontal articulated robot of at least an embodiment of the present invention, the power force of the motor is reduced by the Harmonic Drive (registered trade mark) wave-motion gearing device and transmitted to the supporting-arm portion or the supported-arm portion. Therefore, it is possible in at least an embodiment of the present invention that the reduction ratio is increased in the power transmitting path from the motor to the supporting-arm portion or the supported-arm portion. Accordingly, in at least an embodiment of the present invention, even if a motor with small output is used, the supported-arm portion can be rotated relative to the supporting-arm portion; as a result, the size of the motor can be reduced. Also, in at least an embodiment of the present invention, the power force of the motor is reduced by the Harmonic Drive (registered trade mark) wave-motion gearing device and transmitted to the supporting-arm portion or the supported-arm portion; therefore, backlash can be reduced in the power transmitting path from the motor to the supporting-arm portion or the supported-arm portion.

In at least an embodiment of the present invention, the arm is configured by arm portions, namely, a first arm portion, of which the base end is rotatably joined to the main body portion, and a second arm portion as a supporting-arm portion, of which the bae end is rotatably joined to the front end of the first arm portion, and a third arm portion as a supported-arm portion, of which the base end is rotatably joined to the front end of the second arm portion; the hand is rotatably joined to the front end of the third arm portion.

In at least an embodiment of the present invention, it is preferred that the horizontal articulated robot be provided with a first hand and a second hand as a hand, which overlap in the up-down direction, a first rotation mechanism for rotating the first hand with respect to the third arm portion, and a second hand rotation mechanism for rotating the second hand with respect to the third arm portion; the first hand rotation mechanism be provided with a motor for the first hand arranged inside the third arm portion and the second hand rotation mechanism be provided with a motor for the second hand arranged inside the third arm; the first hand be provided with a joining portion which is joined to the third arm portion and a flat mounting portion on which objects-to-be-transferred are to be mounted, and be positioned below the second hand; the mounting portion be formed extending in the horizontal direction from the top edge of the joining portion, a protrusion portion protruding upwardly be formed to the third arm portion; the protrusion portion be formed at the position shifted from the joining portion in the longitudinal direction of the third arm portion while the third arm portion and the first hand are overlapped in the up-down direction, and protrude upwardly up to the height at which it does not touch the mounting portion; the motor for the first hand and the motor for the second hand be respectively arranged inside the third arm portion such that the output shaft thereof faces down and part of them are located inside the protrusion portion. With this configuration, part of the first hand motor and the second hand motor can be positioned by using the protrusion portion protruding to the dead space created between the mounting portion of the first hand and the third arm portion. Therefore, the entire thickness of the first hand, the second hand and the third arm portion in the up-down direction can be reduced.

In at least an embodiment of the present invention, it is preferred that the rotation mechanism be provided with a magnetic fluid seal arranged around the outer circumferential side of the Harmonic Drive (registered trade mark) wave-motion gearing device. With this configuration, dust generated at the Harmonic Drive (registered trade mark) wave-motion gearing device can be prevented from coming to the outside.

As described above, to achieve the above, it is possible in the horizontal articulated robot of at least an embodiment of the present invention that the horizontal articulated robot can be installed such that the hand can make precise movements in the horizontal direction with ease in a relatively short amount of time. Also, in the horizontal articulated robot manufactured by the method for manufacturing a horizontal articulated robot of at least an embodiment of the present invention, the horizontal articulated robot can be installed such that the hand can make precise movements in the horizontal direction with ease in a short amount of time.

As described above, to achieve the above, in the horizontal articulated robot of at least an embodiment of the present invention having motors which are arranged in the arm portion configuring part of the arm such that the axial direction of their output shaft is in the horizontal direction, the size of the motor can be reduced and backlash can be reduced.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2 A perspective view of the horizontal articulated robot of FIG. 1, showing that the arm is raised and extended.

FIG. 3 A plan view of a semiconductor manufacturing system in which the horizontal articulated robot of FIG. 1 is used.

FIG. 6 A perspective view of the horizontal articulated robot of FIG. 5, showing that the arm is raised and extended.

FIG. 12 A cross-sectional view of a rotation mechanism looking along a rotation axis according to at least an embodiment.

DETAILED DESCRIPTION

Figure 1:
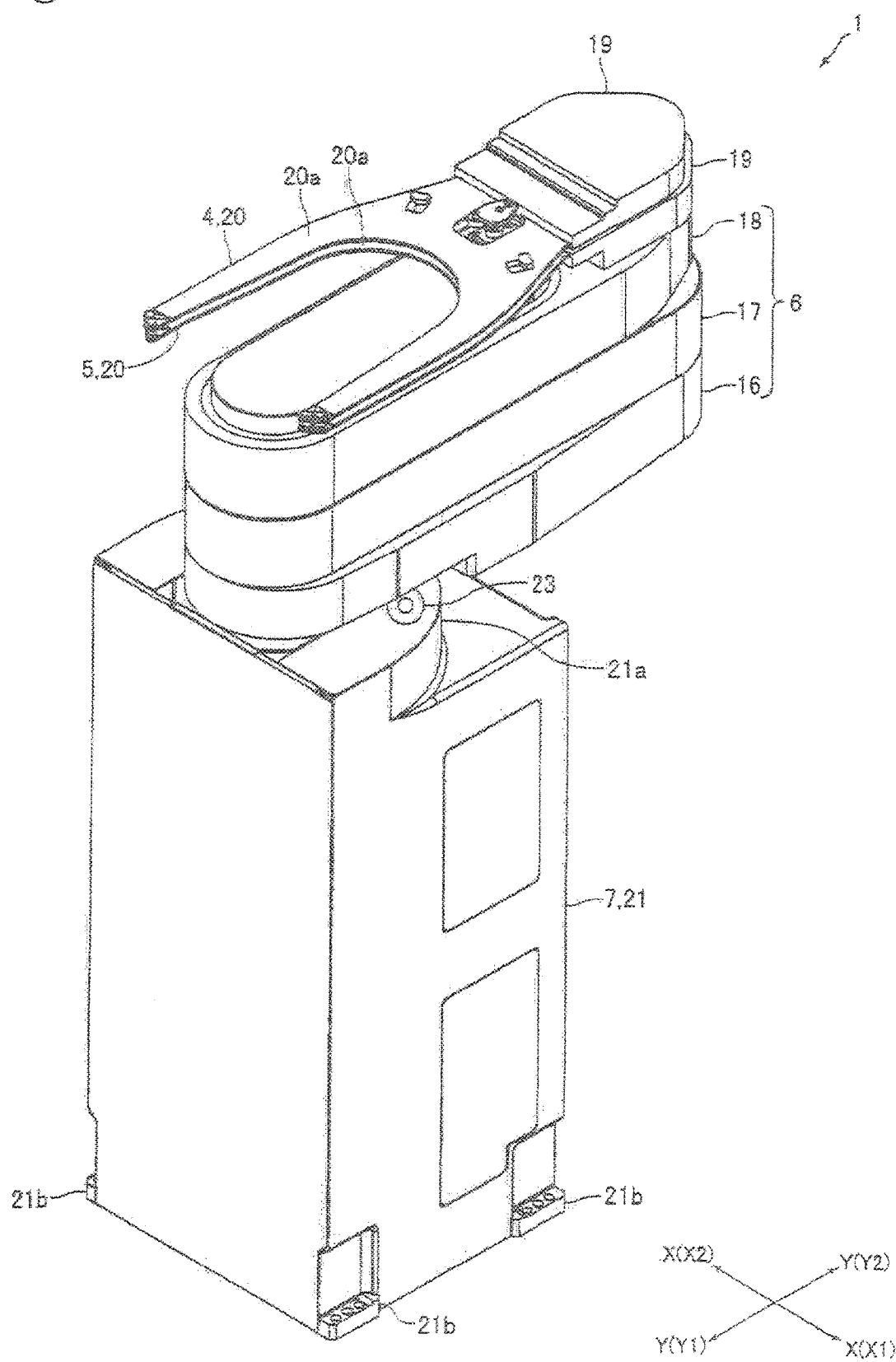
FIG. 1 A perspective view of a horizontal articulated robot of a first embodiment of the present invention.

A first embodiment is described referring to the drawing.
(Configuration of Horizontal Articulated Robot)

Figure 4:
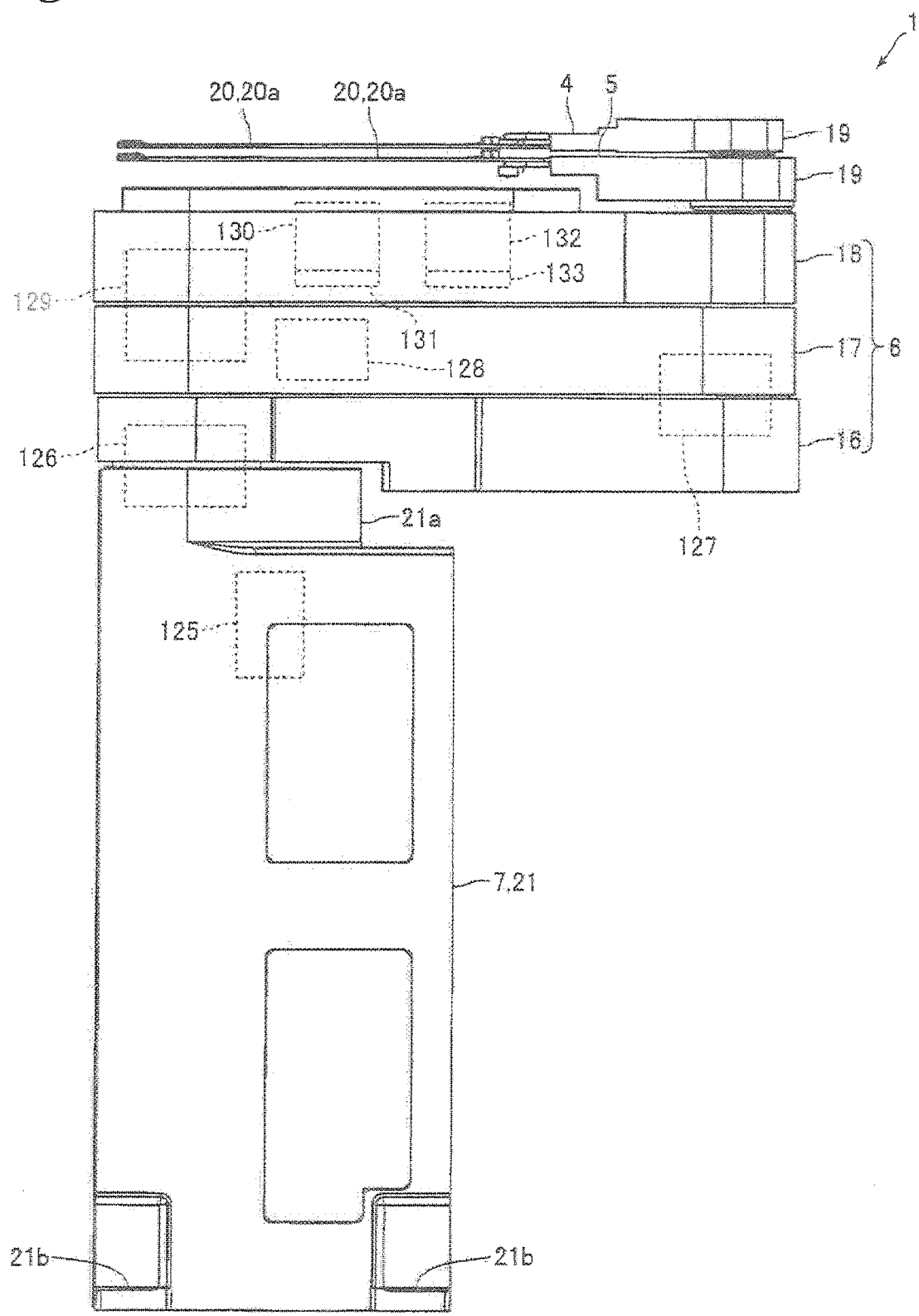
FIG. 4 A side view of the horizontal articulated robot of FIG. 1.

FIG. 1 is a perspective view of a horizontal articulated robot 1 of the first embodiment of the present invention. FIG. 2 is a perspective view of the horizontal articulated robot 1 of FIG. 1, showing an arm 6 raised and extended. FIG. 3 is a plan view of a semiconductor manufacturing system 9 in which the horizontal articulated robot 1 of FIG. 1 is used. FIG. 4 is a side view of the horizontal articulated robot of FIG. 1.

The horizontal articulated robot 1 of this embodiment is a robot for transferring semiconductor wafers 2 which are objects-to-be-transferred (see FIG. 3). The horizontal articulated robot 1 is provided with two hands 4 and 5 on which semiconductor wafers are to be mounted, an arm 6 to which the hands 4 and 5 are rotatably joined to the front end thereof and which moves in the horizontal direction, and a main body portion 7 to which the base end of the arm 6 is rotatably joined. In the following description, the horizontal articulated robot 1 is denoted as the "robot 1" and the semiconductor wafer 2 as the "wafer 2". Also, in the following description, the X direction orthogonal to the up-down direction in FIG. 1, etc. is the "left-right direction"; the Y direction orthogonal to the up-down direction and the left-right direction is the "front-rear direction; the X1 direction side is the "right" side; the X2 direction side is the "left" side; the Y1 direction side is the "front" side; the Y2 direction side is the "rear" side.

As shown in FIG. 3, the robot 1 is installed and used in a semiconductor manufacturing system 9. The a semiconductor manufacturing system 9 is provided with an EFEM 10 and a semiconductor wafer processing device 11 which performs predetermined processes on wafers 2. The EFEM 10 is positioned on the front side of the semiconductor wafer processing device 11. The robot 1 configures part of the EFEM 10. Also, the EFEM 10 is provided with multiple load ports 13 for opening and closing FOUPs 12 and a housing 14 in which the robot 1 is housed. The housing 14 is formed in a rectangular parallelepiped box shape elongated in the left-right direction. The inside of the housing is kept as a clean space. In other words, the inside of the EFEM 10 is a clean space in which a predetermined cleanliness is maintained.

The FOUP 12 is manufactured based on the SEMI standard, in which 25 or 13 individual wafers 2 can be stored, lying on top of another in the up-down direction. The load ports 13 are arranged on the front side of the housing 14. The EFEM 10 of this embodiment is provided with four load ports 13 arranged at a predetermined pitch in the left-right direction, and four FOUPs 12 are arranged in the left-right direction at a predetermined pitch in the EFEM 10. The robot 1 transfers wafers 2 between the four FOUPs 12 and the semiconductor wafer processing device 11.

The arm 6 is configured by a first arm portion 16, of which the base end is rotatably joined to the main body portion 7, a second arm portion 17, of which the base end is rotatably joined to the front end of the first arm portion 16, and a third arm portion, of which the base end is rotatably joined to the front end of the second arm portion 17. In other words, the arm 6 has three arm portions which are relatively rotatably joined to one another. The first arm portion 16, the second arm portion 17 and the third arm portion 18 are formed hollow. Also, in this embodiment, the length of the first arm portion 16, the length of the second arm portion 17, and the length of the third arm portion 18 are the same. The main body portion 17, the first arm portion 16, the second arm portion 17, and the third arm portion 18 are arranged in this order from the bottom. The third arm portion 18 of this embodiment is a hand-side arm portion, and the second arm portion 17 is a second hand-side arm portion.

The hands 4 and 5 are respectively formed such that the shape thereof when viewed in the up-down direction is a Y shape, and are respectively configured by a joint section 19 which is joined to the third arm portion 18 and a wafer mounting portion 20 on which wafers 2 are to be mounted. The hands 4 and 5 are arranged to overlap in the up-down direction. More specifically, the hand 4 is positioned at the top and the hand 5 is positioned at the bottom. The hands 4 and 5 are positioned above the third arm portion 18.

The joint section 19 configures the base end part of the hand 4, 5 and is rotatably joined to the front end of the third arm portion 18. The wafer mounting portion 20 configures the front end portion of the hand 4, 5 and is forked. The top surface of the wafer mounting portion 20 is a mounting-face 20a on which wafers 2 are to be mounted. An adjusting bolt (no illustration in the figure) is attached to the joint between the joint portion 19 and the third arm portion 18 to finely adjust the inclination of the mounting face 20a with respect to the horizontal direction. Also, a screw hole in which the adjusting bolt is screwed is formed in the joint of the joining portion 19 and the third arm portion 18; the inclination of the mounting face 20a is adjusted with respect to the horizontal direction by how much the adjusting bolt is screwed into the screw hole.

Note that the illustration of the hand 5 is omitted in FIG. 3. Also, the hand 4 and the hand 5 sometimes overlap in the up-down direction during the operation of the robot 1 of this embodiment; however, most of the time, the hand 4 and the 5 do not overlap in the up-down direction. When the hand 4 is placed in the FOUP 12 as shown by long dashed double-short line, for example, the hand 5 is rotated toward the main body portion 7 and thus is not in the FOUP 12. The angle of rotation of the hand 5 with respect to the hand 4 at that time is between 120° and 150°, for example.

The main body portion 7 is provided with the housing 21 and a column member 22 (see FIG. 2) to which the base end of the first arm portion 16 is rotatably joined. The housing 21 is formed in a rectangular parallelepiped shape elongated in the up-down direction, and the shape of the housing 21 when viewed in the up-down direction is rectangular or square. The front face and the rear face of the housing 21 are parallel to the plane created by the up-down direction and the left-right direction; the left and right side faces of the housing 21 are parallel to the plane created by the up-down direction and the front-rear direction. Also, the bottom face of the housing 21 is formed to be a planar orthogonal to the up-down direction.

The column member 22 is formed to be a column elongated in the up-down direction. The base end of the first arm portion 16 is rotatably joined to the top end of the column member 22. Housed inside the housing 21 is an arm-elevating mechanism (no illustration) for raising and lowering the column member 22. In other words, housed inside the housing 21 is an arm-elevating mechanism for raising and lowering the first arm portion 16 (that is, the arm 6) with respect to the main body portion 7. The arm-elevating mechanism is configured by a ball screw positioned having the up-down direction as its axial direction, a nut member which engages with the ball screw and a motor for rotating the ball screw. The arm-elevating mechanism raises and lowers the arm 6 and the column member 22 between the position at which the column member 22 is stored inside the housing 21 as shown in FIG. 1 and the position at which the column member 22 protrudes upwardly from the housing 21 as shown in FIG. 2.

The column member 22 is positioned on the front side of the housing 21. Also, the column member 22 is positioned in the center of the housing 21 in the left-right direction. A protrusion portion 21a is formed on the top of the housing 21, protruding upwardly. The protrusion portion 21a is formed surrounding the left and right sides and the rear side of the column member 22. The top surface of the protrusion portion 21a is formed to be a flat plane orthogonal to the up-down direction. Also, at the four corners at the bottom of the housing 21, a bolt mounting portion 21b is formed to mount the adjusting bolt (no illustration) which finely adjusts the inclination of the entire robot 1 with respect to the horizontal direction. A screw hole in which the adjusting bolt is screwed is formed in the bolt mounting portion 21b such that it passes through in the up-down direction, and the inclination of the robot 1 with respect to the horizontal direction is adjusted by the amount of screwing the adjusting bolt into the screw hole.

As shown in FIG. 1 and FIG. 2, a level 23 is attached to the top surface of the protrusion portion 21a. In other words, the level 23 is attached to the main body portion 7. The level 23 of this embodiment is a bubble tube-type level with a bubble tube. More specifically, the level 23 is a so-called bull's eye spirit level (a spirit level) having the bubble tube in a circular shape when viewed in the up-down direction and with a circular reference line printed at the center of the bubble tube when viewed in the up-down direction. Note that the level 23 may be a bubble tube-type level other than a bull's eye spirit level, such as a dual-axis level which is a combination of a single-axis-type bubble tube level that can check the inclination of one side in the horizontal direction (for example, the left-right direction) and a single-axis-type bubble tube level that can check the inclination of the direction orthogonal to one side in the horizontal direction (for example, the front-rear direction).

Also, the robot 1 is provided with an arm portion drive mechanism which rotates the first arm portion 16 and the second arm portion 17 to extend and retract part of the arm 6 configured by the first arm portion 16 and the second arm portion 17, a third arm drive mechanism which rotates the third arm portion 18, a first hand-drive mechanism which rotates the hand 4 and a second hand-drive mechanism which rotates the hand 5.

As shown in FIG. 4, the arm portion drive mechanism is provided with a motor 125 as a driving source, a reduction gear 126 for reducing the power of the motor 125 and transmitting the result to the first arm portion 16, and a reduction gear 127 for reducing the power of the motor 125 and transmitting the result to the second arm portion 17. The motor 125 is arranged inside the housing 21. The reduction gear 126 configures a joint section connecting the main body portion 7 and the first arm portion 16. The reduction gear 127 configures a joint section connecting the first arm portion 16 and the second arm portion 17. The reduction gears 126 and 127 are a Harmonic Drive (registered trade mark) wave-motion gearing device, for example. In the same manner as the horizontal articulated robot disclosed in the above-described Patent reference 1, the motor 125 and the reduction gear 126 are coupled with each other via a pulley and a belt whose illustrations are omitted in the figures, and the motor 125 and the reduction gear 127 are coupled via a pulley and a belt whose illustrations are omitted in the figures.

The third arm portion drive mechanism, as shown in FIG. 4, is provided with a motor 128 which is a driving source and a reduction gear 129 for reducing the power of the motor 128 and transmitting the result to the third arm portion 18. The motor 28 is arranged inside the front end of the second arm portion 17. The reduction gear 129 configures a joint section connecting the second arm portion 17 and the third arm portion 18. The reduction gear 129 is a Harmonic Drive (registered trade mark) wave-motion gearing device, for example. The motor 128 and the reduction gear 129 are coupled via a gear train whose illustration is omitted in the figures.

The first hand drive mechanism, as shown in FIG. 4, is provided with a motor 130 and a reduction gear 131 for reducing the power of the motor 130 and transmitting the result to the hand 4. The second hand drive mechanism, in the same manner as the first hand drive mechanism, is provided with a motor 132 and a reduction gear 133 for reducing the power of the motor 132 and transmitting the result to the hand 5. The motors 130 and 132 and the reduction gears 131 and 133 are arranged inside the third arm portion 18. The reduction gears 131 and 133 are a Harmonic Drive (registered trade mark) wave-motion gearing device, for example. In the same manner as the horizontal articulated robot disclosed in the above-described Patent reference 1, the reduction gear 131 is attached to the output shaft of the motor 130, the reduction gear 133 is attached to the output shaft of the motor 132. Also, the joining portion 19 of the hand 4 and the reduction gear 131 are connected via a pulley and a belt whose illustrations are omitted in the figures, and the joining portion 19 of the hand 5 and the reduction gear 133 are connected via a pulley and a belt whose illustrations are omitted in the figures.

In the process of manufacturing the robot 1, once the hands 4 and 5, the arm 6 and the main body portion 7 are assembled together to enable the robot 1 to move, the robot 1 is placed on a predetermined reference surface where planarity is maintained. At this time, the level 23 is not attached to the main body portion 7 yet. Then, the inclination of the center axis of rotation of the third arm portion 18 with respect to the second arm portion 17 is adjusted with respect to the up-down direction (the vertical direction). Also, the inclination of the mounting face 20a of the hand 4, 5 is adjusted with respect to the horizontal direction.

More specifically, while changing the position of the robot 1 to various states, such as the state in which the arm 6 is extended in a certain direction, the state in which the arm is extended in the other direction, and the state in which the arm 6 is retracted, the inclination of the entire robot 1 is adjusted by the adjusting bolt attached to the bolt attaching portions 21b in the housing 21 so that the center axis of rotation of the third arm portion 18 with respect to the second arm portion 17 does not incline more than a predetermined angle with respect to the vertical direction; in this way, the inclination of the center axis of rotation of the third arm portion 18 with respect to the second arm portion 17 can be adjusted with respect to the vertical direction.

Also, while changing the position of the robot 1 to various states, the inclination of the mounting face 20a with respect to the horizontal direction is adjusted by the adjusting bolt attached to the joining place between the joining portion 19 and the third arm portion 18 so that the inclination of the mounting face 20a with respect to the horizontal direction does not incline more than a predetermined angle with respect to the horizontal direction no matter what state the robot 1 is in. Note that the gap between the hand 4 and the hand 5 in the up-down direction is also adjusted.

When these adjustments are completed, the level 23 is attached to the main body portion 7. More specifically, the level 23 is secured to the main body portion 7 such that the bubble in the bubble tube of the level 23 is contained within the reference line printed on the bubble tube.

(Major Effects of the First Embodiment)

As described above, in this embodiment, first the inclination of the center axis of rotation of the third arm portion 18 with respect to the second arm portion 17 is adjusted with respect to the vertical direction and the inclination of the mounting face 20a of the hand 4, 5 is adjusted with respect to the horizontal direction, and then the level 23 is attached to the main body portion 7 such that the bubble in the bubble tube of the level 23 is contained within the reference line printed on the bubble tube. Therefore, in this embodiment, at the time of the installation of the robot 1 in the housing 14 of the EFEM 10, the robot 1 is positioned such that the bubble in the bubble tube of the level 23 is contained within the reference line; as a result, the robot 1 can be installed such that the inclination of the center axis of rotation of the third arm portion 18, to which the hands 4 and 5 are rotatably joined, with respect to the second arm portion 17 is adjusted to a proper inclination with respect to the vertical direction, and the inclination of the mounting face 20a with respect to the horizontal direction is adjusted to a proper inclination. Therefore, in this embodiment, the robot 1 can be installed in the housing 14 such that the hands 4 and 5 can make precise movements in the horizontal direction with ease in a short amount of time.

In the case in which the level 23 is attached to the hands 4 and 5 or the arm 6, the bubble in the bubble tube of the level 23 easily changes its position depending on the extended or retracted position of the arm 6; therefore, even if the robot 1 is positioned in the housing 14 such that the bubble is contained within the reference line, the robot 1 may not be installed in the housing 14 to have the hands 4 and 5 make precise movements in the horizontal direction, depending on the extended/retracted state of the arm 6 at the installation. However, in this embodiment, the level 23 is attached to the main body portion 7; therefore, the bubble in the bubble tube of the level 23 does not change its position easily despite the extended/retracted state of the arm 6. Therefore, in this embodiment, by positioning the robot in the housing 14 such that the bubble in the level 23 is contained within the reference line, the robot 1 can be installed in the housing 14 to have the hands 4 and 5 make precise movements in the horizontal direction despite the extended/retracted state of the arm 6 at the time of installation.

OTHER EMBODIMENTS

The above-described first embodiment is an example of the preferred embodiment of the present invention; however, the embodiment is not limited to this, but can be varyingly modified within the scope of the invention.

In the above-described embodiment, first the inclination of the center axis of rotation of the third arm portion 18 with respect to the second arm portion 17 is adjusted with respect to the vertical direction and the inclination of the mounting face 20a of the hand 4, 5 is adjusted with respect to the horizontal direction, and then the level 23 is attached to the main body portion 7 such that the bubble in the bubble tube of the level 23 can be contained within the reference line printed on the bubble tube. Beside this, under the condition where the inclination of the center axis of rotation of the third arm portion 18 with respect to the second arm portion 17 is adjusted with respect to the vertical direction but the inclination of the mounting face 20a is not adjusted with respect to the horizontal direction, the level 23 may be attached to the main body portion 7 such that the bubble in the bubble tube of the level 23 is contained within the reference line printed on the bubble tube. Once the inclination of the center axis of rotation of the third arm portion 18 with respect to the second arm portion 17 is adjusted with respect to the vertical direction, the inclination of the hand 4, 5 with respect to the horizontal direction can be controlled; therefore, even in this case, by positioning the robot 1 in the housing 14 such that the bubble in the bubble tube of the level 23 is contained within the reference line, the robot 1 can be installed in the housing 14 to have the hands 4 and 5 make precise movements in the horizontal direction.

In the above-described embodiment, the level 23 is attached to the main body portion 7. Beside this, the level 23 may be attached to the arm 6 or the hand 4 or the hand 5. Also, in the above-described embodiment, the level 23 is a bubble tube-type level; however, the level 23 may be a laser level or a digital level other than a bubble tube-type level.

In the above-described embodiment, the main body portion 7 is formed in a rectangular parallelepiped shape elongated in the up-down direction; however, the main body portion 7 may be formed in a columnar shape or in a polygonal columnar shape having a hexagonal or octagonal shape when viewed in the up-down direction. Also, in the above-described embodiment, the two hands 4 and 5 are attached to the front end of the third arm portion 18; however, one hand may be attached to the front end of the third arm portion 18. Also, in the above-described embodiment, the arm 6 is configured by three arm portions which are the first arm portion 16, the second arm portion 17 and the third arm portion 18; however, the arm 6 may be configured by two arm portions or four or more arm portions.

In the above-described embodiment, the semiconductor wafer processing apparatus 11 is positioned on the rear side of the EFEM 10 in the semiconductor manufacturing system 9. Beside this, the semiconductor wafer processing apparatus 11 may be arranged on the right side, left side or both sides of the EFEM 10. For example, as shown by long dashed double-short line in FIG. 3, the semiconductor wafer processing apparatus 11 may be positioned on the right side of the EFEM 10. Also, in the above-described embodiment, the robot 1 is a robot for transferring wafers 2; however, the robot 1 may be a robot for transferring other objects-to-be-transferred such as liquid crystal glass substrates.

Second Embodiment

The second embodiment of the present invention is hereinafter described referring to the drawing.
(Entire Configuration of Horizontal Articulated Robot)

Figure 5:
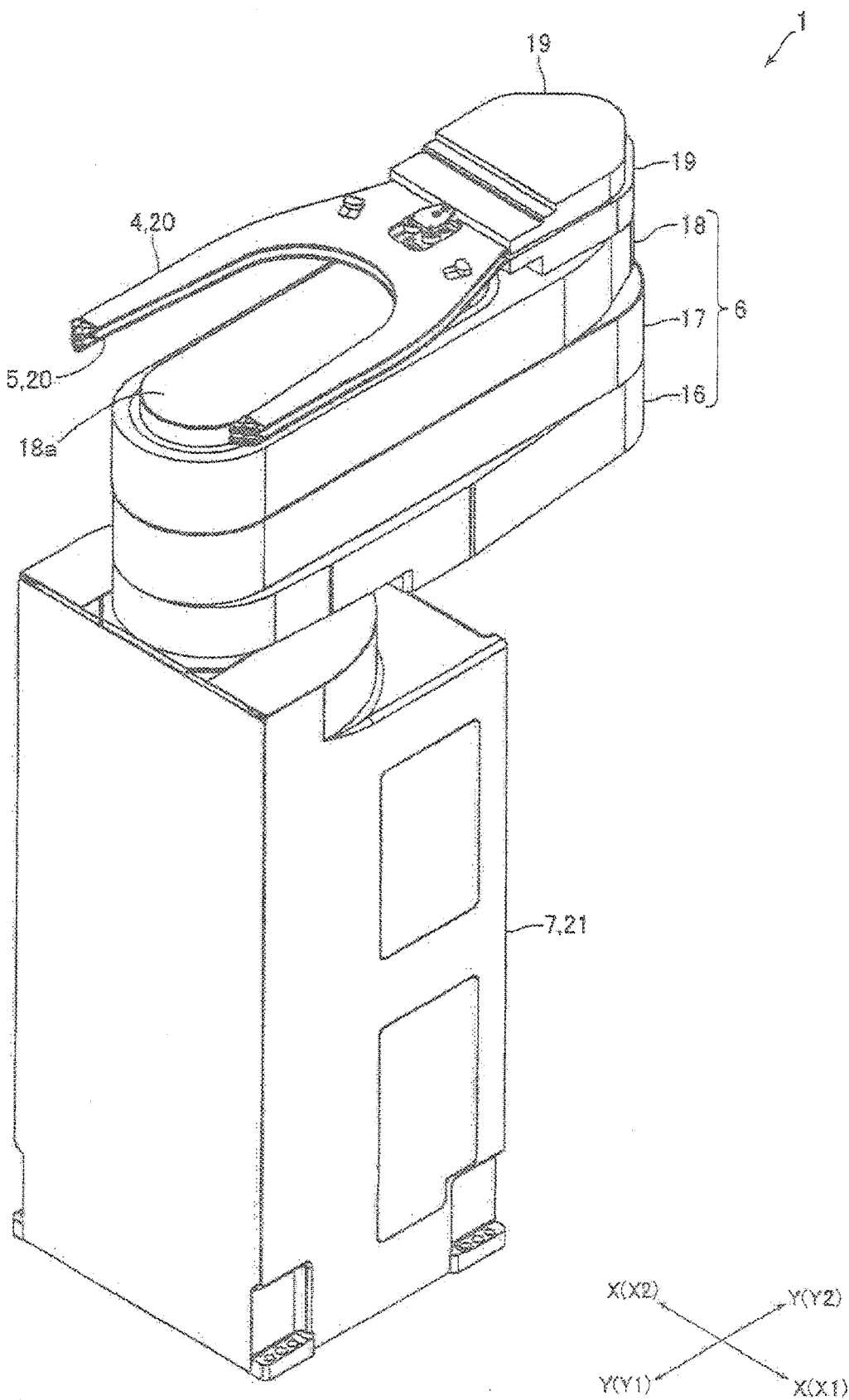
FIG. 5 A perspective view of a horizontal articulated robot of a second embodiment.
Figure 7:
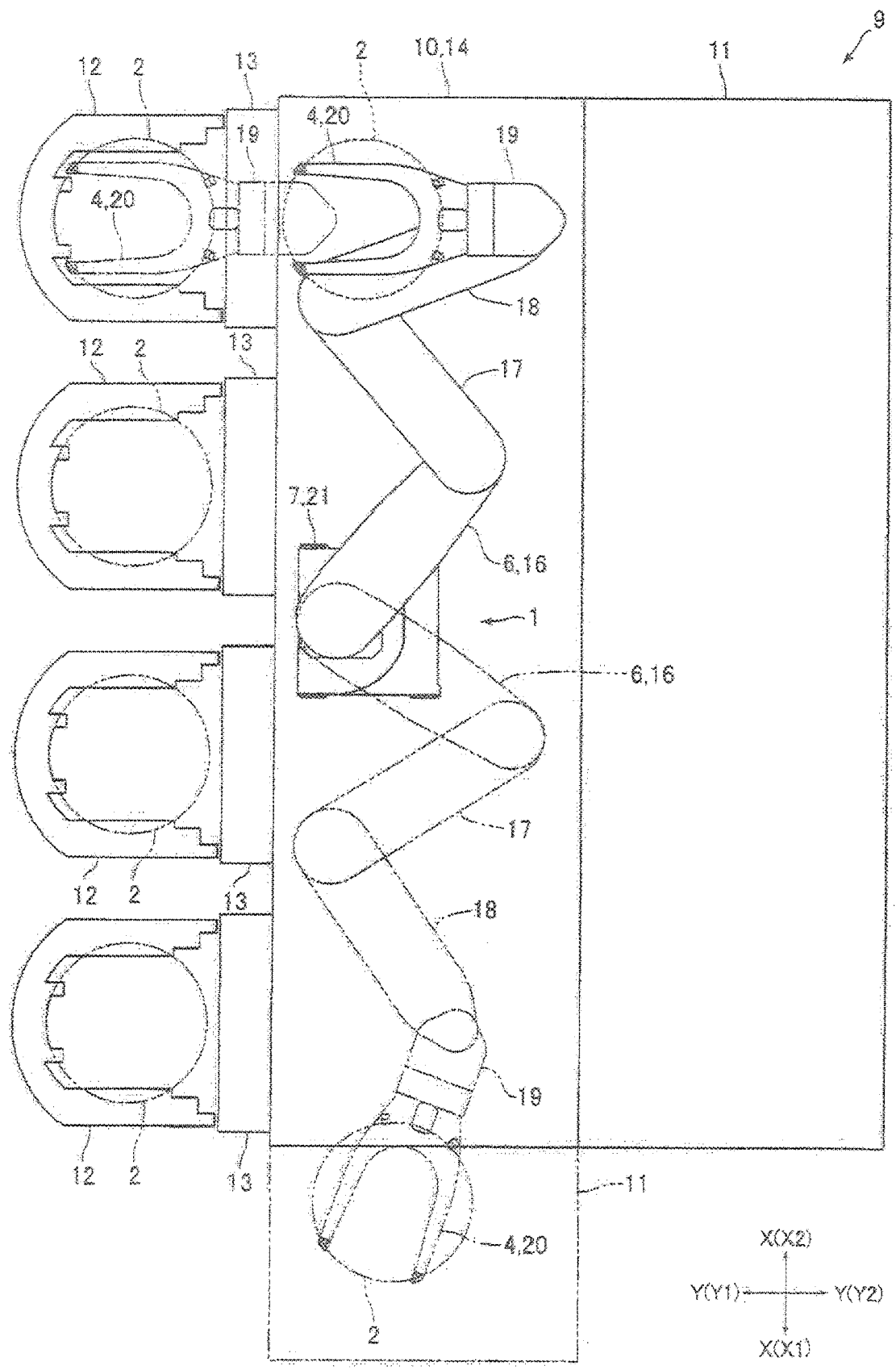
FIG. 7 A plan view of a semiconductor manufacturing system in which the horizontal articulated robot of FIG. 5 is used.
Figure 8:
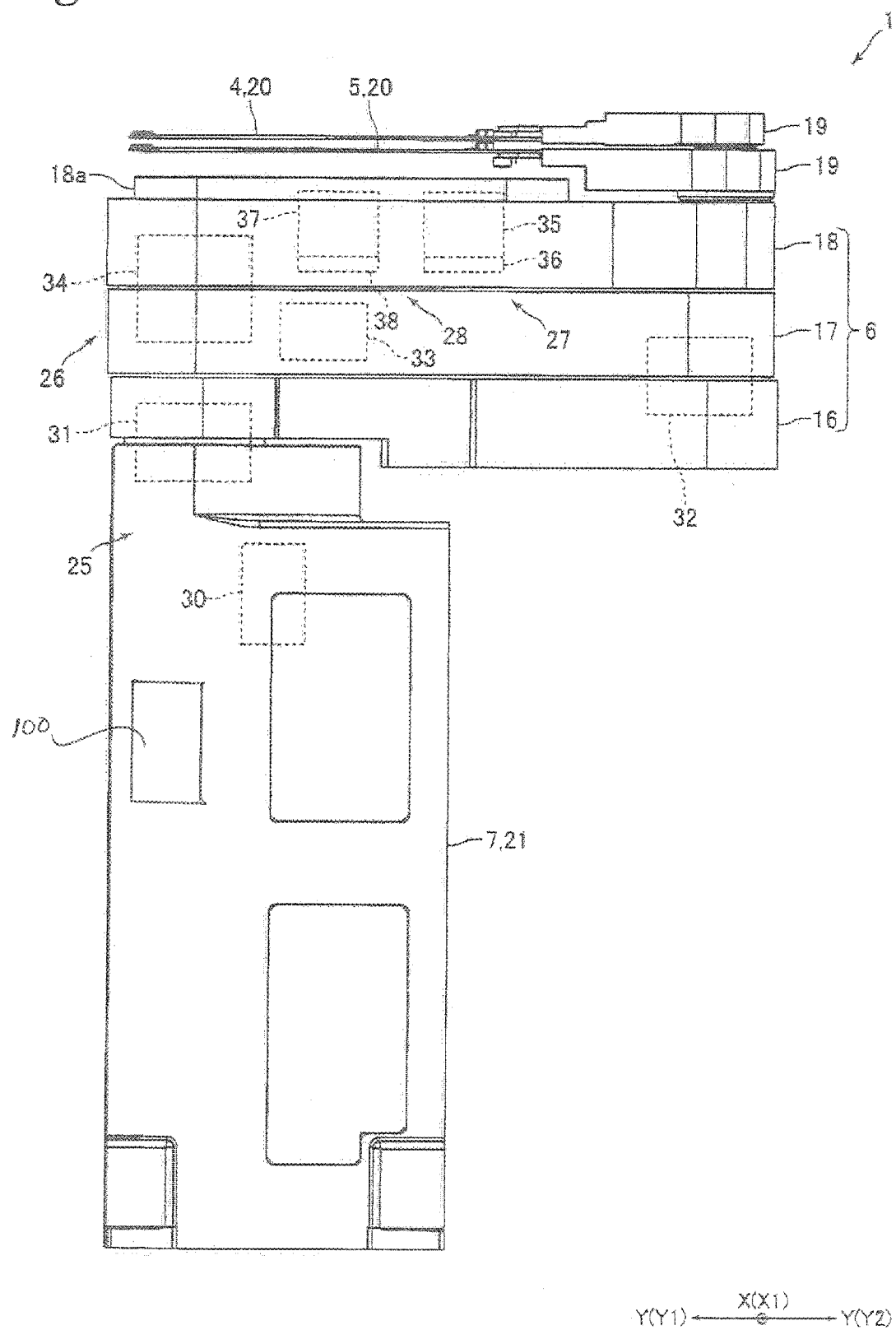
FIG. 8 A side view of the horizontal articulated robot of FIG. 5.

FIG. 5 is a perspective view of a horizontal articulated robot 1 of the second embodiment of the present invention. FIG. 6 is a perspective view of the horizontal articulated robot 1 of FIG. 5 with the arm 6 elevated and extended. FIG. 7 is a plan view of a semiconductor manufacturing system 9 in which the horizontal articulated robot 1 of FIG. 5 is used. FIG. 8 is a side view of the horizontal articulated robot 1 of FIG. 5. Note that the same codes are given to the same components as the above-described first embodiment.

The horizontal articulated robot 1 of the second embodiment is a robot for transferring semiconductor wafers 2 which are objects-to-be-transferred (see FIG. 7). This horizontal articulated robot 1 is provided with two hands 4 and 5 on which semiconductor wafers 2 are to be mounted, an arm 6 to which the front end of the hands 4 and 5 are rotatably joined and which moves in the horizontal direction, and a main body portion 7 to which the base end of the arm 6 is rotatably joined. In the following description, the horizontal articulated robot 1 is denoted as a "robot 1" and the semiconductor wafer 2 a "wafer 2". Also, in the following description, the X direction in FIG. 5 which is orthogonal to the up-down direction is "the left-right direction", the Y direction which is orthogonal to the up-down direction and the left-right direction is "the front-rear direction", the X1 direction side is the "right" side, the X2 direction side the "left" side, the Y1 direction side the "front" side and the Y2 direction side the "rear" side.

As shown in FIG. 7, the robot 1 is installed and used in the semiconductor manufacturing system 9. The semiconductor manufacturing system 9 is provided with the EFEM 10 and the semiconductor wafer processing apparatus 1 for performing predetermined process on wafers 2. The EFEM 10 is positioned on the front side of the semiconductor wafer processing apparatus 11. The robot 1 configures part of the EFEM 10. Also, the EFEM 10 is provided with multiple load ports 13 for opening and closing the FOUPs 12 and a housing 14 in which the robot is housed. The housing 14 is formed in a rectangular parallelepiped box shape elongated in the left-right direction. The inside of the housing 14 is a clean space. In other words, the inside of the EFEM 10 is a clean space in which predetermined cleanliness is maintained.

The FOUP 12 is manufactured based on the SEMI standard and 25 or 13 individual wafers 2 can be stored. The load ports 13 are arranged on the front side of the housing 14. The EFEM 10 of this embodiment is provided with four load ports 13 arranged at a predetermined pitch in the left-right direction, and four FOUPs 12 are arranged at a predetermined pitch in the left-right direction in the EFEM 10. The robot 1 transfers wafers 2 between the four FOUPs 12 and the semiconductor wafer processing apparatus 11.

The arm 6 is configured by a first arm portion, of which the base end is rotatably joined to the main body portion 7, a second arm portion 17, of which the base end is rotatably joined to the front end of the first arm portion 16, and a third arm portion 18, of which the base end is rotatably joined to the front end of the second arm portion 17. In other words, the arm 6 has three arm portions which are relatively rotatably joined to one another. The first arm portion 16, the second arm portion 17 and the third arm portion 18 are formed hollow. Also, in this embodiment, the length of the first arm portion 16, the length of the second arm portion 17 and the length of the third arm portion are the same. The main body portion 7, the first arm portion 16, the second arm portion 17 and the third arm portion 18 are positioned in this order from the bottom. The second arm portion 17 of this embodiment is a supporting arm portion, and the third arm portion 18 is a supported arm portion.

The hands 4 and 5 are formed to have a Y shape when viewed in the up-down direction, and are respectively configured by a joining portion 19 joined to the third arm portion 18 and a mounting portion on which wafers 2 are to be mounted. The hands 4 and 5 are arranged such that the joining portion 19 of the hand 4 and the joining portion 19 of the hand 5 overlap with each other in the up-down direction. More specifically described, the hand 4 is positioned at the top and the hand 5 is positioned at the bottom. Also, the hands 4 and 5 are arranged above the third arm portion 18. The hand 5 of this embodiment is the first hand, and the hand 4 is the second hand.

The joining portion 19 configures the base end portion of the hands 4 and 5 and is rotatably joined to the front end of the third arm portion 18. The mounting portion 20, configuring the front end portion of the hands 4 and 5, is forked. Also, the mounting portion 20 is formed to be flat. As shown in FIG. 8, the mounting portion 20 of the hand 4 is formed extending from the bottom end of the joining portion 19 in the horizontal direction, and the mounting portion 20 of the hand 5 is formed extending from the top end of the joining portion 19 in the horizontal direction. The top surface of the mounting portion 20 is a mounting face on which wafers 2 are to be mounted.

Note that the illustration of the hand 5 is omitted in FIG. 7. Also, at the time of operation of the robot 1 of this embodiment, the hand 4 and the hand 5 sometimes overlap in the up-down direction; however, most of the time, the hand 4 and the hand 5 do not overlap in the up-down direction. For example, as shown by long dashed double-short line in FIG. 7, when the hand 4 is placed in the FOUP 12, the hand 5 is rotated toward the main body portion 7, not being in the FOUP 12. The angle of rotation of the hand 5 with respect to the hand 4 at that time is between 120° and 150°.

Also, a protruding portion 18a is formed to the third arm portion 18, protruding upwardly. As shown in FIG. 8, the protruding portion 18a is formed at the position which is shifted from the joining portion 19 of the hand 5 in the longitudinal direction of the third arm portion 18 (in the front-rear direction in the state shown by FIG. 8) so that it does not touch the joining portion 19 of the hand 5 when the third arm portion 18 and the hand 5 are overlapped in the up-down direction. Also, the protruding portion 18a protrudes upwardly to the height at which it does not touch the mounting portion 20.

The main body portion 7 is provided with a housing 21 and a column member 22 (see FIG. 6), to which the base end of the first arm portion 16 is rotatably joined. The housing 21 is formed to be rectangular parallelepiped shape elongated in the up-down direction, with a rectangular or square shape when viewed in the up-down direction. Also, the front face and the rear face of the housing 21 are parallel to the plane created by the up-down direction and the left-right direction; the right and left side faces of the housing 21 is parallel to the plane created by the up-down direction and the front-rear direction.

The column member 22 is formed to be a thin column elongated in the up-down direction. The base end of the first arm portion 16 is rotatably joined to the top end of the column member 22. Housed inside the housing 21 is an arm-elevating mechanism (no illustration) for raising and lowering the column member 22. In other words, housed inside the housing 21 is an arm-elevating mechanism for raising and lowering the first arm portion 16 (that is, the arm 6) with respect to the main body portion 7. The arm-elevating mechanism is configured by a ball screw, which is arranged having the up-down direction as its axial direction, a nut member which engages with the ball screw, and a motor for rotating the ball screw. The arm-elevating mechanism raises and lowers the arm 6 and the column member 22 between the position at which the column member is housed in the housing 21, as shown in FIG. 5, and the position at which the column member 22 protrudes upwardly from the housing 21, as shown in FIG. 6. The column member 22 is arranged on the front side of the housing 21. Also, the column member 22 is positioned in the center of the housing 21 in the left-right direction.

The robot 1 is also provided with an arm portion-driving mechanism 25 which rotates the first arm portion 16 and the second arm portion 17 to extend and retract part of the arm 6, which is configured by the first arm portion 16 and the second arm portion 17, a third arm portion rotating mechanism 26 as a rotating mechanism for rotating the third arm portion 18 with respect to the second arm portion 17, a first hand-rotating mechanism 27 for rotating the hand 5 with respect to the third arm portion 18, and a second hand-rotating mechanism 28 for rotating the hand 4 with respect to the third arm portion 18.

As shown in FIG. 8, the arm portion-driving mechanism 25 is provided with a motor 30 which is a driving source, a reduction gear 31 for reducing the power of the motor 30 and transmitting the result to the first arm portion 16, and a reduction gear 32 for reducing the power of the motor 30 and transmitting the result to the second arm portion 17. The motor 30 is arranged inside the housing 21. The reduction gear 31 configures a joint section that joins the main body portion 7 and the first arm portion 16. The reduction gear 32 configures a joint section that joins the first arm portion 16 and the second arm portion 17. The reduction gear 31, 32 is a Harmonic Drive (registered trade mark) wave-motion gearing device, for example. In the same manner as the industrial robot disclosed in the above-described Unexamined Japanese Patent Application Publication 2011-230256, the motor 30 and the reduction gear 31 are connected with each other via a pulley and a belt whose illustrations are omitted in the figure. Also, the motor 30 and the reduction gear 32 are connected with each other via a pulley and a belt whose illustrations are omitted in the figure, in the same manner as the industrial robot disclosed in the above-described Unexamined Japanese Patent Application Publication 2011-230256.

The third arm portion-driving mechanism 27, as shown in FIG. 8, is provided with a motor 35 which is a driving source and a reduction gear 36 for reducing the power of the motor 28 and transmitting the result to the third arm portion 18. The more detailed configuration of the third arm portion-rotating mechanism 26 is described later.

The first hand-rotating mechanism 27, as shown in FIG. 8, is provided with a motor 35 which is a driving source, and a reduction gear 36 for reducing the power of the motor 35 and transmitting the result to the hand 5. In the same manner as the first hand-rotating mechanism 27, the second hand-rotating mechanism 28 is provided with a motor 37 which is a driving source and a reduction gear 38 for reducing the power of the motor 37 and transmitting the result to the hand 4. The motor 35 of this embodiment is the motor for the first hand, and the motor 37 is the motor for the second hand.

The motors 35, 37 and the reduction gears 36, 38 are arranged inside the third arm portion 18. Also, the motors 35 and 37 are each respectively arranged inside the third arm portion 18 such that its output shaft faces down and part of its counter-output shaft is placed in the protruding portion 18a of the third arm portion 18. The reduction gears 36 and 38 are a Harmonic Drive (registered trade mark) wave-motion gearing device, for example. The reduction gear 36 is attached to the output shaft of the motor 35 protruding downwardly, and the reduction gear 38 is attached to the output shaft of the motor 37 protruding downwardly. In the same manner as the horizontal articulated robot disclosed in the Unexamined Japanese Patent Application Publication 2011-230256, the joining portion 19 of the hand 5 and the reduction gear 36 are connected to each other via a pulley and a belt whose illustrations are omitted in the figure, and the joining portion 19 of the hand 4 and the reduction gear 36 are connected to each other via a pulley and a belt whose illustrations are omitted in the figure.

(Configuration of Third Arm Portion-Rotating Mechanism)

Figure 9:
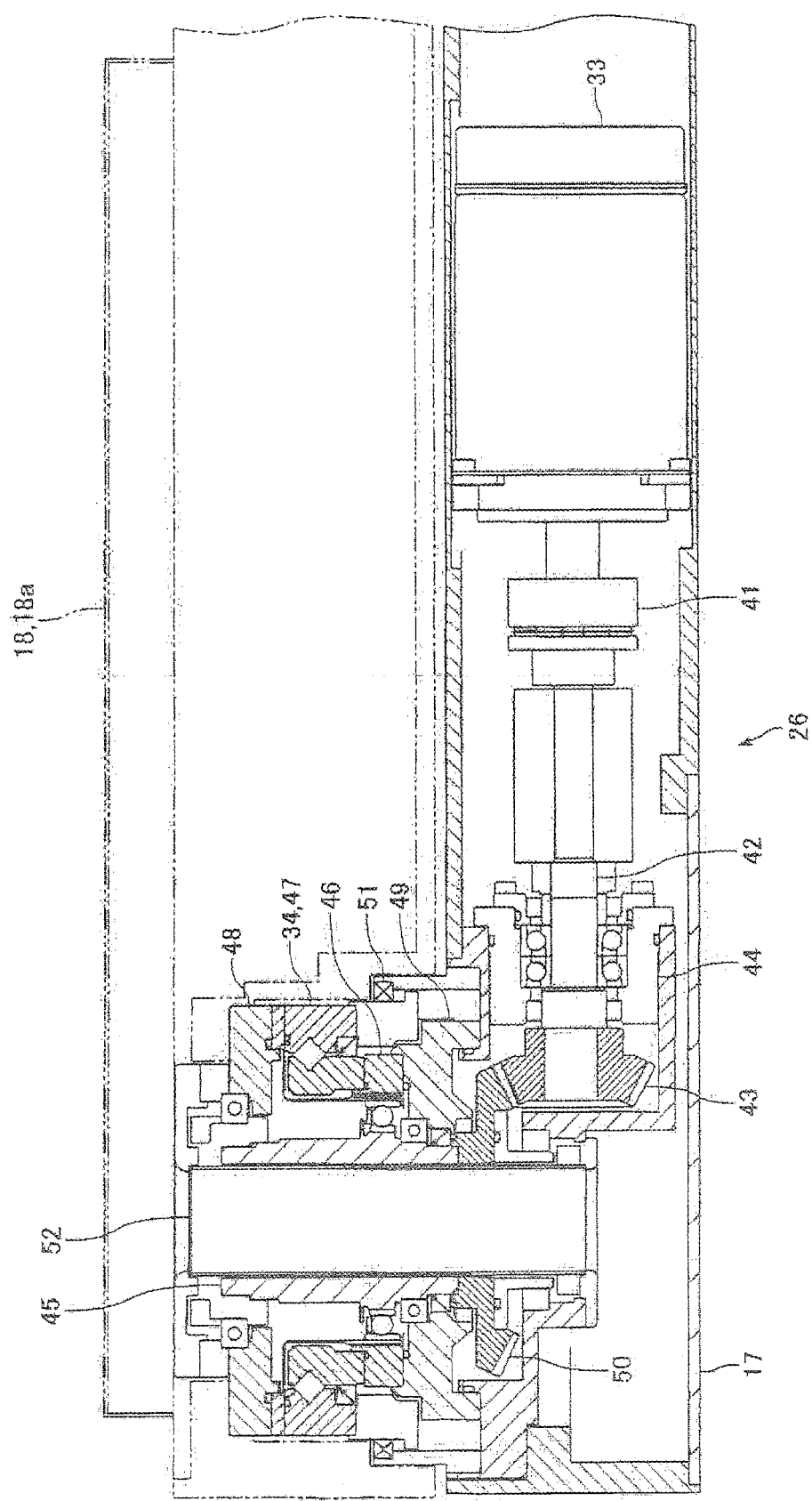
FIG. 9 A cross-sectional view to explain the configuration of a rotation mechanism shown in FIG. 8.

FIG. 9 is a cross-sectional view to explain the configuration of the third arm portion-rotating mechanism 26 shown in FIG. 8.

The third arm portion-rotating mechanism 26 is provided with the motor 33 and the reduction gear 34 as described above. The motor 33 is arranged inside the second arm portion 17. The motor 33 is also secured inside the second arm portion 17 such that the axial direction of its output shaft is parallel to the horizontal direction. More specifically, the motor 33 is secured inside the second arm portion 17 such that its output shaft protrudes toward the front end of the second arm portion 17.

One end of the rotating shaft 42 is coupled with the output shaft of the motor 33 via a coupling. The rotating shaft 42 is arranged inside the second arm portion 17 such that its axial direction coincides with the horizontal direction. In other words, a bevel gear 43 is coupled with the output shaft of the motor 33 via the coupling 41 and the rotating shaft 42. Also, the other end of the rotating shaft 42 is rotatably held by a bearing which is secured inside the second arm portion 17.

The reduction gear 34 configures a joint section connecting the second arm portion 17 and the third arm portion 18. In other words, the reduction gear 34 configures a joint section which is a joining portion between the second arm portion 17 ad the third arm portion 18. The reduction 34 is arranged having its axial direction in the up-down direction. The reduction gear 34 also is a Harmonic Drive (registered trade mark) wave-motion gearing device, and as shown in FIG. 5, is configured by a wave generator 45, a circular spline 46 and a flex spline 47. The flex spline 47 is secured to the base end of the third arm portion 18 via a frame 48. The circular spline 46 is fixed to the front end of the second arm portion 17 via a frame 49. A bevel gear 50 as a second bevel gear is secured to the bottom end of the wave generator 45. In other words, the bevel gear 50 is secured to the bottom end of the wave generator 45. The bevel gear 50 meshes with a bevel gear 34.

On the outer circumferential side of the gear 34, a magnetic fluid seal 51 is arranged to prevent dust generated at the reduction gear 34 from going outside of the second arm portion 17 and the third arm portion 18. Also, a hollow shaft 52 arranged to pass through the center of the reduction gear 34 is secured on the base end side of the third arm portion 18. The wave generator 45 is rotatably arranged at the outer circumferential side of the hollow shaft 52. Note that a predetermined wiring is done, utilizing the inner circumference side of the hollow shaft 52.

(Major Effects of This Second Embodiment)

As described above, in the second embodiment of the present invention, the power of the motor 33 is reduced by the reduction gear 34, which is a Harmonic Drive (registered trade mark) wave-motion gearing device, and transmitted to the third arm portion 18. Therefore, in this embodiment, the reduction ratio can be increased in the power-transmitting path from the motor 33 to the third arm portion 18. Therefore, in this embodiment, even when the motor 33 uses a motor with small output, the third arm portion 18 can be rotated with respect to the second arm portion; as a result, the size of the motor 33 can be reduced. Further, in this embodiment, the power of the motor 33 is reduced and transmitted to the third arm portion 18 by the reduction gear 34 which is a Harmonic Drive (registered trade mark) wave-motion gearing device; therefore, backlash can be reduced in the power-transmitting path from the motor 33 to the third arm portion 18.

In the second embodiment, the protruding portion 18a protruding upwardly is formed to the third arm portion 18. This protruding portion 18a is formed at the position which is shifted from the joining portion 19 of the hand 5 in the longitudinal direction of the third arm portion 18 and also protrudes upwardly to the height at which it is kept from touching the mounting portion 20 of the hand 5. Also, in this embodiment, the motor 35, 37 is arranged inside the third arm portion 18 such that its output shaft faces down and part of its counter-output shaft of the motor 35, 37 is placed in the protruding portion 18a. Therefore, in this embodiment, part of the motor 35, 37 can be positioned, utilizing the protruding portion 18a protruding into the dead space between the mounting portion 20 of the hand 5 and the third arm portion 18 in the up-down direction. Accordingly, in this embodiment, the thickness of the hands 4 and 5 and the third arm portion 18 altogether in the up-down direction can be reduced.

OTHER EMBODIMENT

In the above-described second embodiment is an example of the preferred embodiment of the present invention; however, it is not limited to this, but can be varyingly modified within the scope of the invention.

In the above-described embodiment, the motor 33 is arranged inside the second arm portion 17; however, the motor 33 may be arranged inside the third arm portion 18. In this case, the circular spline 46 is secured on the base end side of the third arm portion 18 via the frame 49, and the flex spline 47 is secured on the base end side of the third arm portion 18 via the frame 48. Also, in this case, the power of the motor 33 is reduced by the reduction gear 34 and transmitted to the second arm portion 17.

In the above-described embodiment, the arm 6 is configured by three arm portions which are the first arm portion 16, the second arm portion 17 and the third arm portion 18; however, the arm 6 may be configured by two arm portions or by four or more arm portions. Also, two hands 4 and 5 are attached on the front end side of the third arm portion 18 in the above-described embodiment; however, only one hand may be attached on the front end side of the third arm portion 18.

In the above-described embodiment, the semiconductor wafer processing apparatus 11 is arranged on the rear side of the EFEM 10 in the semiconductor manufacturing system 9. Beside this, the semiconductor wafer processing apparatus 11 may be positioned on the ride side, the left side or both sides of the EFEM 10. For example, as shown by long dashed double-short line in FIG. 3, the semiconductor wafer processing apparatus 11 may be positioned on the right side of the EFEM 10. Also, in the above-described embodiment, the robot 1 is a robot for transferring wafers 2; however, the robot 1 may be a robot for transferring other type of objects-to-be-transferred such as liquid crystal glass substrates.

Figure 10:
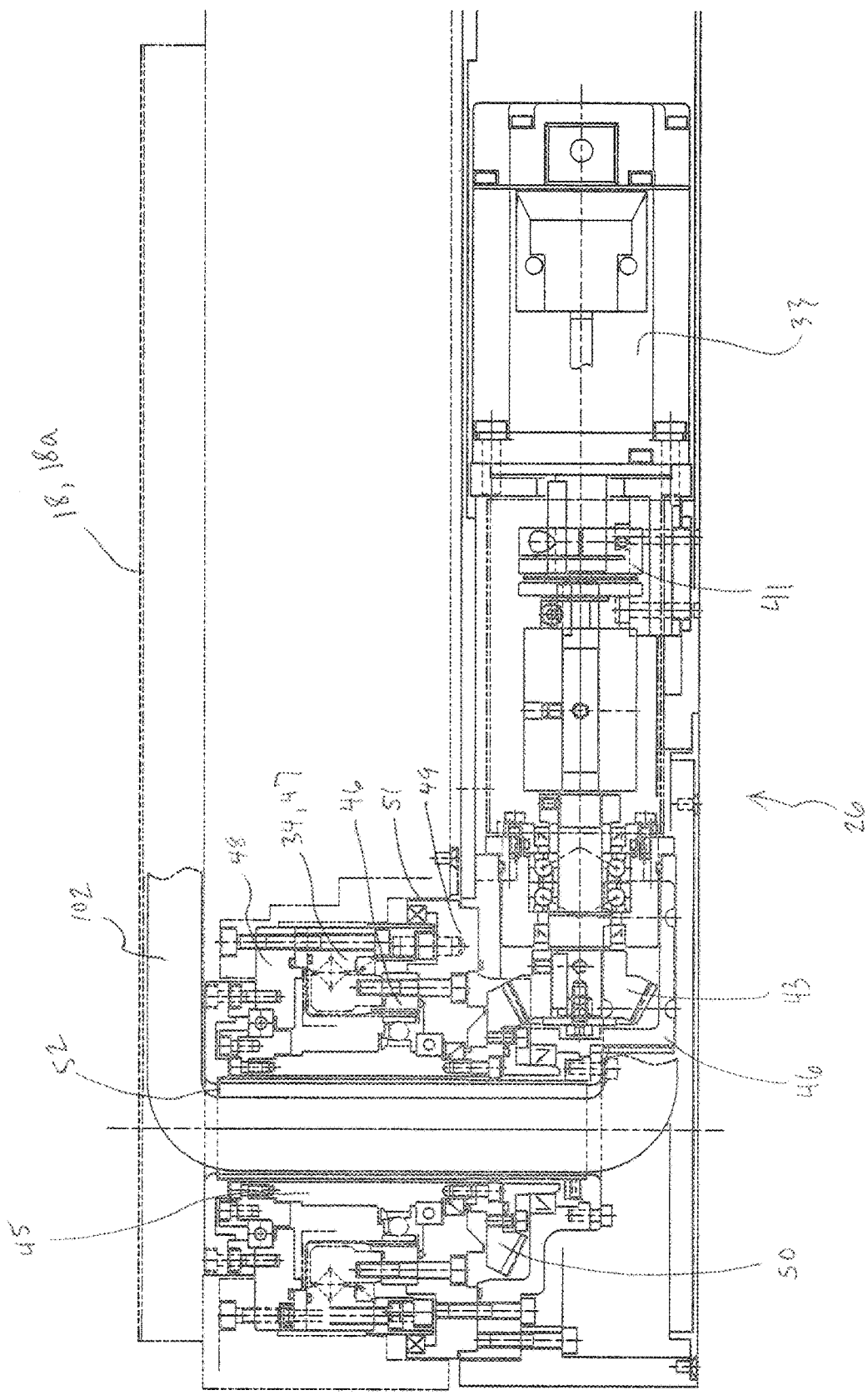
FIG. 10 A cross-sectional view of a rotation mechanism according to at least an embodiment.
Figure 11:
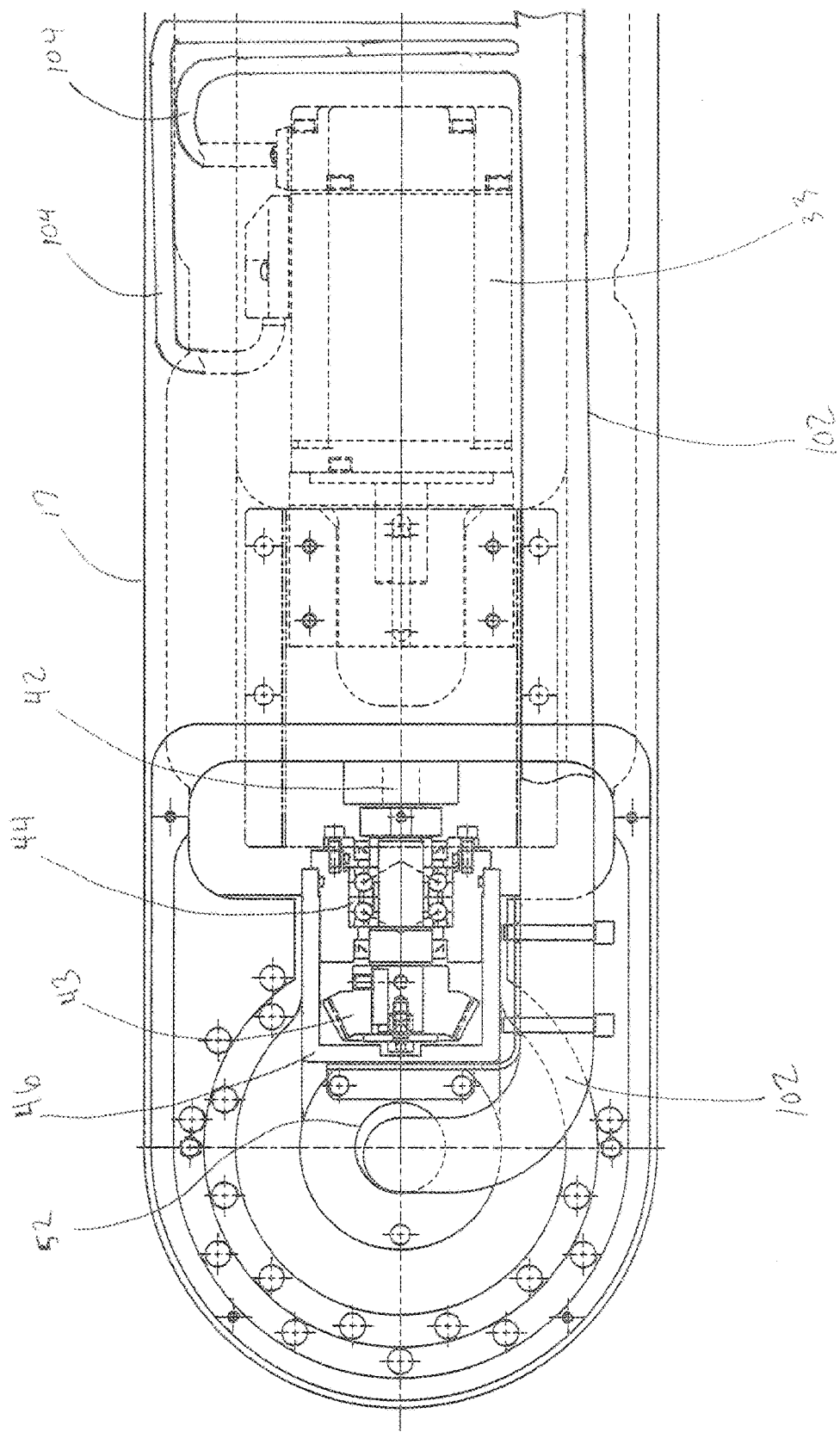
FIG. 11 A cross-sectional view of a rotation mechanism looking along a rotation axis according to at least an embodiment.

In at least an embodiment, structures such as motors 33, 35, 37 and reduction gears 34, 36, 38 may require connection to a power supply. FIG. 8 shows an exemplary embodiment in which a power supply 100 may be provided in main body portion 7. As seen in FIGS. 10-12, power may be supplied from power supply 100 via wiring 102. Wiring 102 may be a single wire or a bundle of multiple individual wires, and other wirings may be spliced into or otherwise connected to wiring 102 in order to supply power to individual components. Wiring 102 may be connected to structures via secondary wirings 104 split off from wiring 102.

FIGS. 10-12 show any exemplary embodiment of a structure for allowing wiring 102 to pass through arm portion rotating mechanism 26. As seen in FIG. 10, wiring 102 may pass through hollow shaft 52 provided radially inward from wave generator 45. The broken line at the ends of wiring 102 is merely for the ease of illustrate, and does not indicate that wiring 102 terminates at these locations.

FIG. 11 shows a view of an exemplary embodiment looking up along hollow shaft 52. As seen in FIG. 11, wiring 102 may be routed around to a side of plate 46 so that it can be routed through second arm portion 17, where wiring 102 may be connected to motors, reduction gears, and other structures as needed. FIG. 12 shows a view of an exemplary embodiment looking down along hollow shaft 52. As seen from FIG. 10 and FIG. 12, wiring 102 exits the hollow shaft 52 and is routed along third arm portion 18, where wiring 102 may be connected to motors, reduction gears, and other structures as needed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A horizontal articulated robot with an arm which moves in the horizontal direction for use with objects to be transferred, comprising:
   a hand on which objects-to-be-transferred are to be mounted;
   said arm having at least two arm portions, comprising:
   a supported-arm portion to which said hand is rotatably joined to the front end thereof and a supporting-arm portion to which the base end of said supporting-arm portion is rotatably joined to the front end thereof;
   a main body portion to which the base end of said arm is rotatably joined; and a rotation mechanism structured to rotate said supported-arm portion with respect to said supporting-arm portion;
wherein said rotation mechanism comprises:
a motor which is arranged inside said supporting-arm portion or said supported-arm portion such that an axial direction of an output shaft of the motor coincides with a horizontal direction,
a Harmonic Drive (registered trade mark) wave-motion gearing device which configures a joining portion as a joint section between said supporting-arm portion and said supported-arm portion and which is structured to reduce the power of said motor and transmits the result to said supporting-arm portion or said supported-arm portion,
a first bevel gear which is coupled to said output shaft of said motor,
and a second bevel gear which is coupled with a wave generator of said Harmonic Drive (registered trade mark) wave-motion gearing device and which meshes with said first bevel gear;
wherein said second bevel gear is provided on an outer circumferential side of hollow shaft of the Harmonic Drive (registered trademark) wave-motion gearing device and on a lower side of a reduction gear of the Harmonic Drive (registered trademark) wave-motion gearing device;
an outside diameter of the first bevel gear is smaller than an outside diameter of the second bevel gear;
the outside diameter of the first bevel gear is smaller than an outside diameter of the motor;
the second bevel gear is provided at an upper side of a shaft center of the output shaft of the motor;
a lower end of the hollow shaft is provided to a lower side of the shaft center of the output shaft of the motor; and
a predetermined wiring is provided on an inner circumference side of the hollow shaft;
wherein axes of rotation of the hand and the at least two arm portions are vertical.

2. The horizontal articulated robot as set forth in claim 1 wherein
said arm comprises a first arm portion, of which the base end is rotatably joined to said main body portion, a second arm portion as a supporting-arm portion, of which the base end is rotatably joined to the front end of said first arm portion, and a third arm portion as said supported-arm portion, of which the base end is rotatably joined to the front end of said second arm portion; and
said hand is rotatably joined to the front end of said third arm portion.

3. The horizontal articulated robot as set forth in claim 2, further comprising:
a first hand and a second hand which are said hand and arranged to overlap in an up-down direction;
a first hand-rotating mechanism for rotating said first hand with respect to said third arm portion; and
a second hand-rotating mechanism for rotating said second hand with respect to said third arm portion;
wherein said first hand comprises a joining portion which is connected to said third arm portion and a flat mounting portion on which said objects-to-be-transferred are to be mounted, and is positioned below said second hand;
said mounting portion is formed extending from the top end of said joining portion in the horizontal direction;
a protrusion portion is formed to said third arm portion, protruding upwardly;
said protrusion portion is formed at the position which is shifted from said joining portion in the longitudinal direction of said third arm portion when said third arm portion and said first hand are not overlapped in the up-down direction, and also protrudes upwardly to the height at which it does not touch said mounting portion;
said motor for the first hand and said motor for the second hand are arranged inside said third arm portion such that their output shafts face downwardly and a portion of them are placed in said protrusion portion.

4. The horizontal articulated robot as set forth in claim 1 wherein said rotation mechanism comprises a magnetic fluid seal arranged around the outer circumference of said Harmonic Drive (registered trade mark) wave-motion gearing device.

* * * * *